United States Patent
Karmous

(10) Patent No.: US 10,403,725 B2
(45) Date of Patent: Sep. 3, 2019

(54) METHOD FOR PROCESSING A SEMICONDUCTOR WORKPIECE AND SEMICONDUCTOR DEVICE

(71) Applicant: INFINEON TECHNOLOGIES AG, Neubiberg (DE)

(72) Inventor: Alim Karmous, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/925,914

(22) Filed: Mar. 20, 2018

(65) Prior Publication Data
US 2018/0277641 A1    Sep. 27, 2018

(30) Foreign Application Priority Data
Mar. 21, 2017    (DE) .................... 10 2017 106 020

(51) Int. Cl.
*H01L 29/40* (2006.01)
*H01L 29/06* (2006.01)
(Continued)

(52) U.S. Cl.
CPC ........ *H01L 29/401* (2013.01); *H01L 29/0623* (2013.01); *H01L 29/407* (2013.01); *H01L 29/4236* (2013.01); *H01L 29/7811* (2013.01); H01L 23/34 (2013.01); H01L 27/0255 (2013.01); H01L 28/24 (2013.01); H01L 29/735 (2013.01); H01L 29/7393 (2013.01); H01L 29/7455 (2013.01); H01L 29/7801 (2013.01); H01L 29/7815 (2013.01); H01L 29/861 (2013.01); H01L 29/88 (2013.01)

(58) Field of Classification Search
CPC ........................... H01L 23/34; H01L 27/0255
See application file for complete search history.

(56) References Cited

U.S. PATENT DOCUMENTS 7,221,011 B2 *  5/2007  Banerjee ............. H01L 29/0878
                                                        257/288
9,397,180 B1 *  7/2016  Yang .................. H01L 29/41708
(Continued)

FOREIGN PATENT DOCUMENTS

DE    112013000925 T5    10/2014
WO       2013120010 A1      8/2013

*Primary Examiner* — Thao P Le
(74) *Attorney, Agent, or Firm* — Viering, Jentschura & Partner MBB

(57) ABSTRACT

A method for processing a semiconductor workpiece, including: forming a trench structure in a first region of a semiconductor workpiece, extending from a surface of the semiconductor workpiece to a first depth, forming at least one recess in a second region of the semiconductor workpiece laterally next to the first region, the recess extending from the surface of the semiconductor workpiece into the semiconductor workpiece to a second depth less than the first depth; forming a material layer over the semiconductor workpiece, the material layer filling the trench structure and recess and covering the surface of the semiconductor workpiece in the first region and in the second region; and planarizing the semiconductor workpiece to partially remove the material layer in the first region and in the second region, wherein the material layer remains in the trench structure and in the at least one recess.

20 Claims, 17 Drawing Sheets

(51) Int. Cl.
*H01L 29/423* (2006.01)
*H01L 29/78* (2006.01)
H01L 29/739 (2006.01)
H01L 27/02 (2006.01)
H01L 29/88 (2006.01)
H01L 49/02 (2006.01)
H01L 23/34 (2006.01)
H01L 29/745 (2006.01)
H01L 29/735 (2006.01)
H01L 29/861 (2006.01)

(56) References Cited

U.S. PATENT DOCUMENTS

| | | | |
|---|---|---|---|
| 2013/0153987 A1* | 6/2013 | Venkatraman | H01L 29/7827 257/329 |
| 2013/0221428 A1* | 8/2013 | Venkatraman | H01L 29/7827 257/330 |
| 2016/0043068 A1* | 2/2016 | Ramachandran | H01L 27/0288 257/532 |
| 2019/0067274 A1* | 2/2019 | Marzaki | H01L 27/0629 |

\* cited by examiner

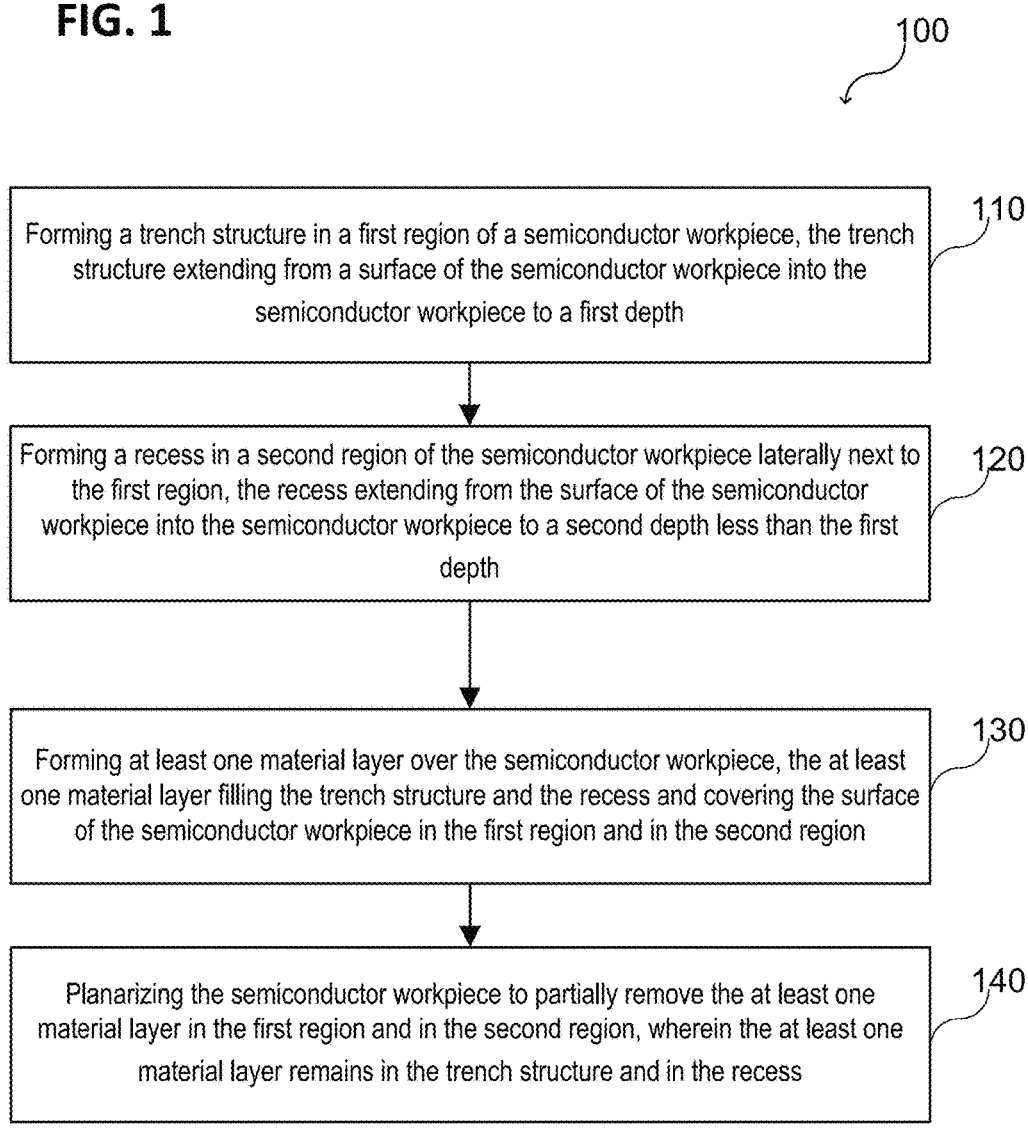

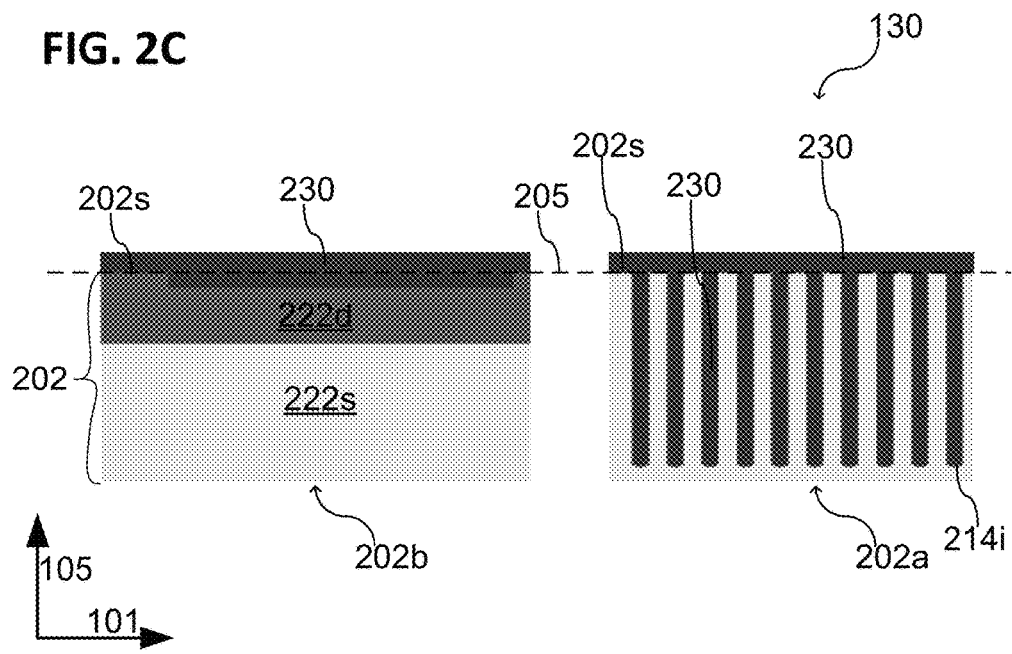
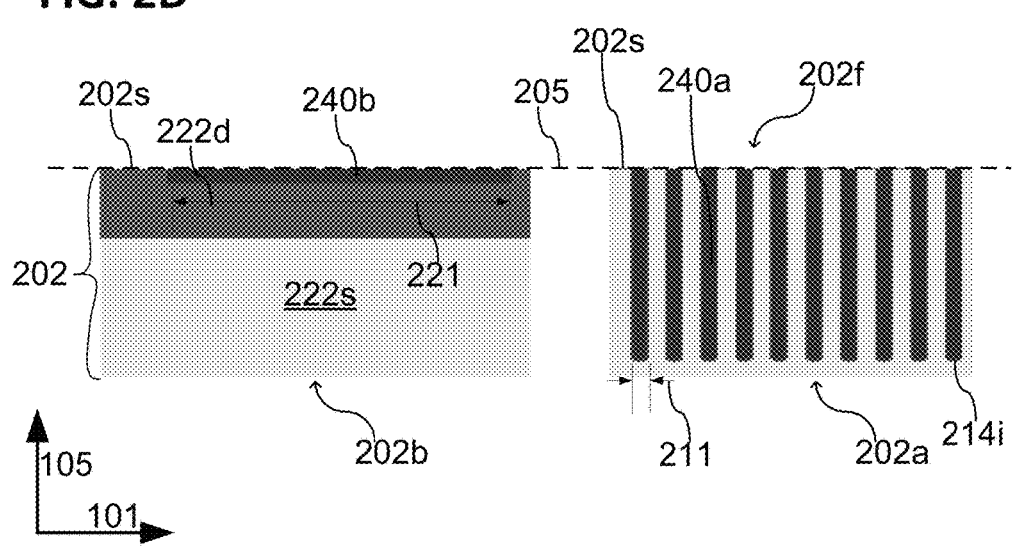

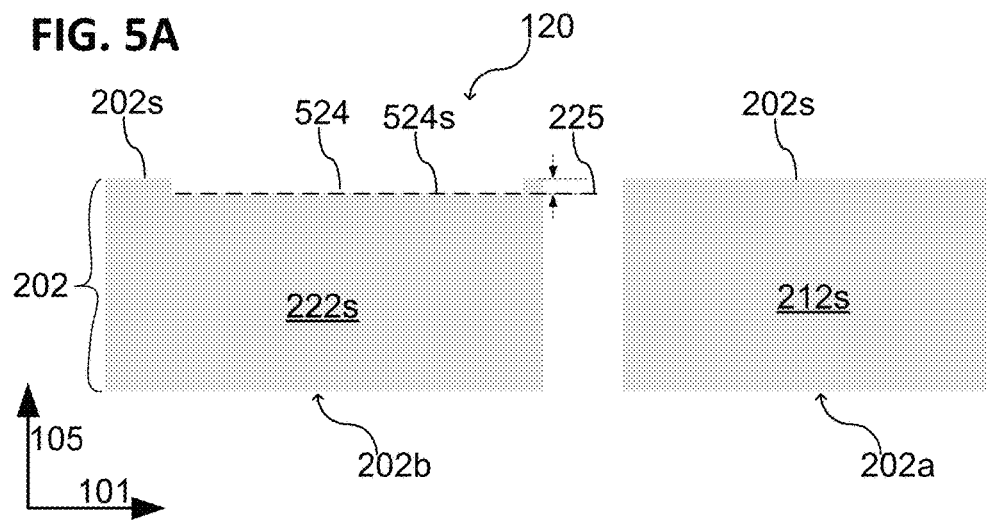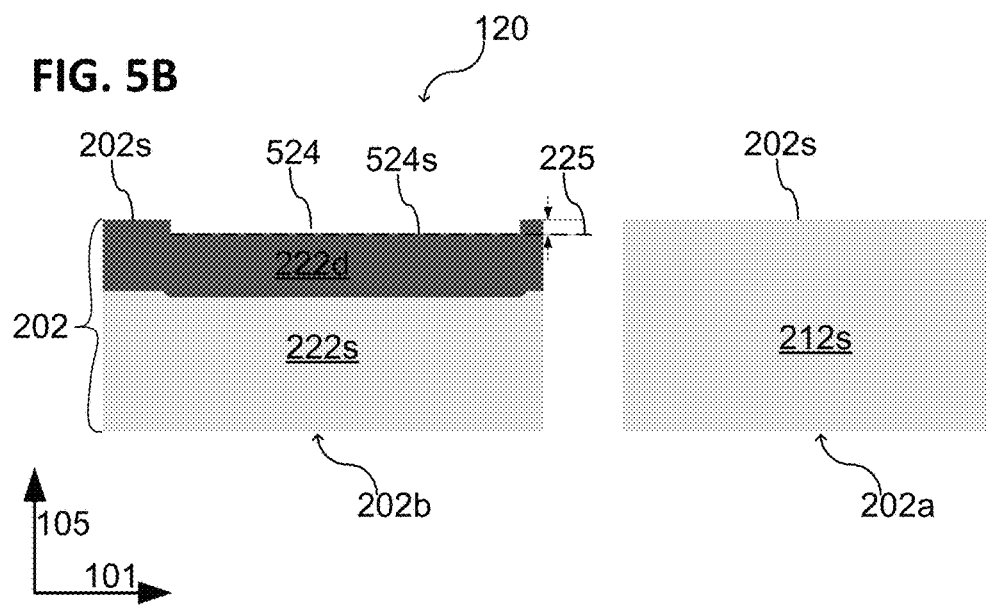

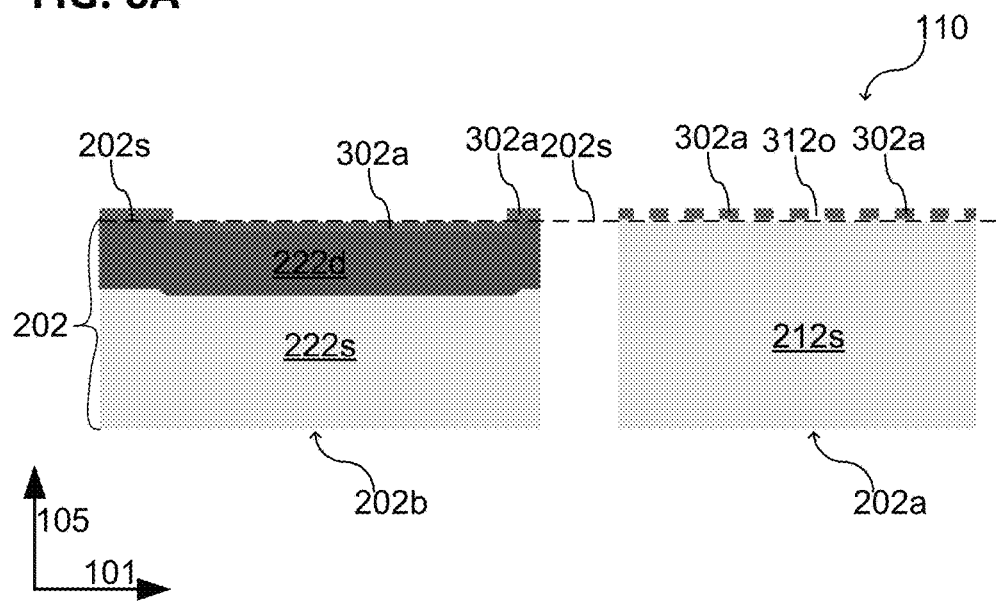
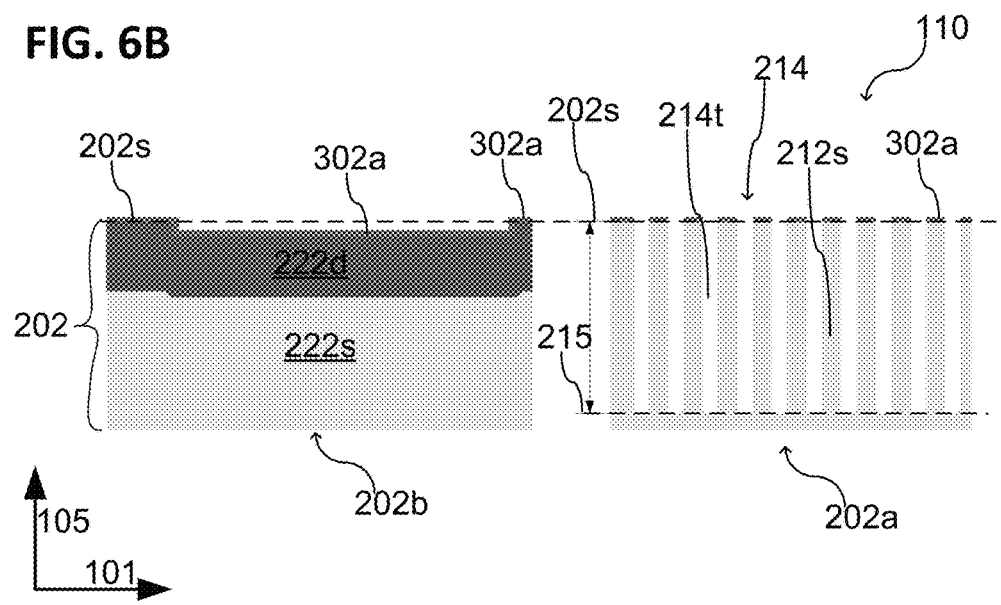

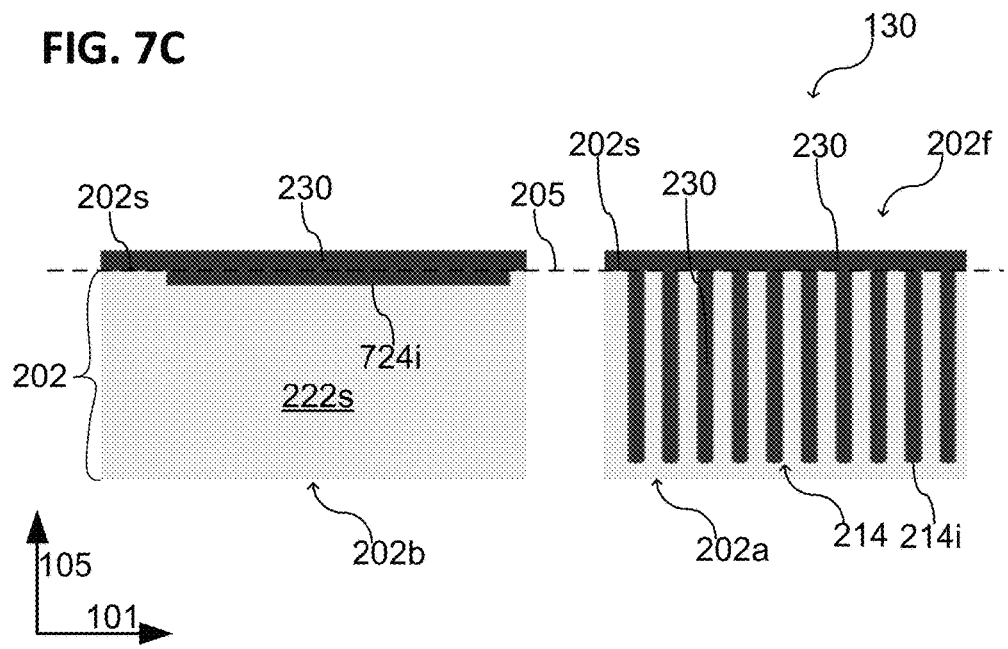
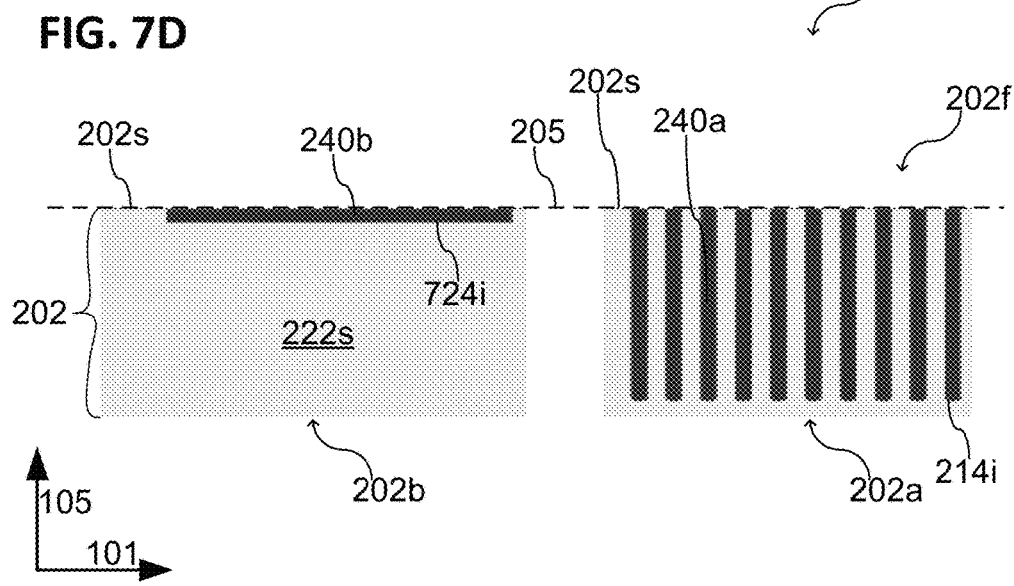

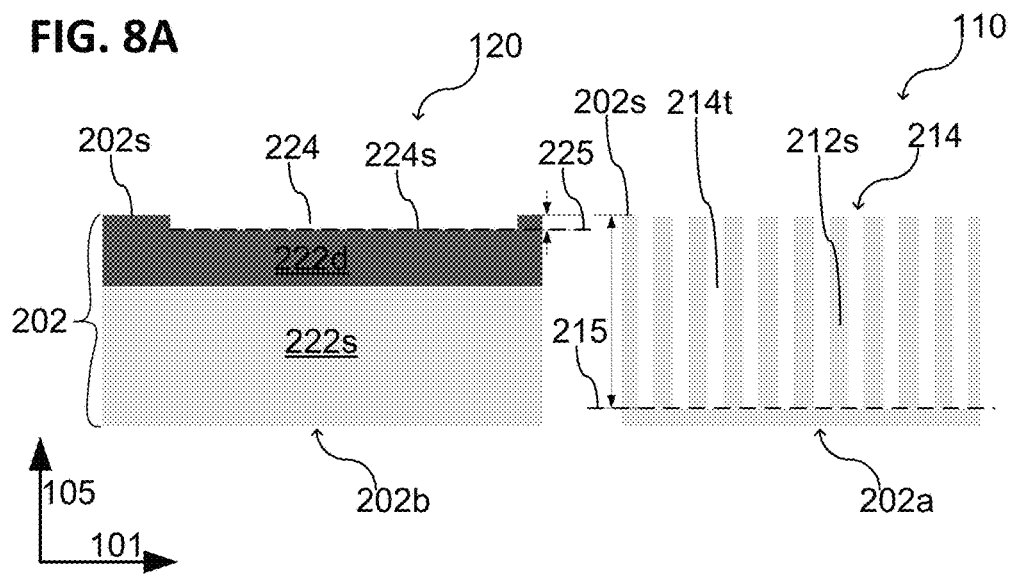
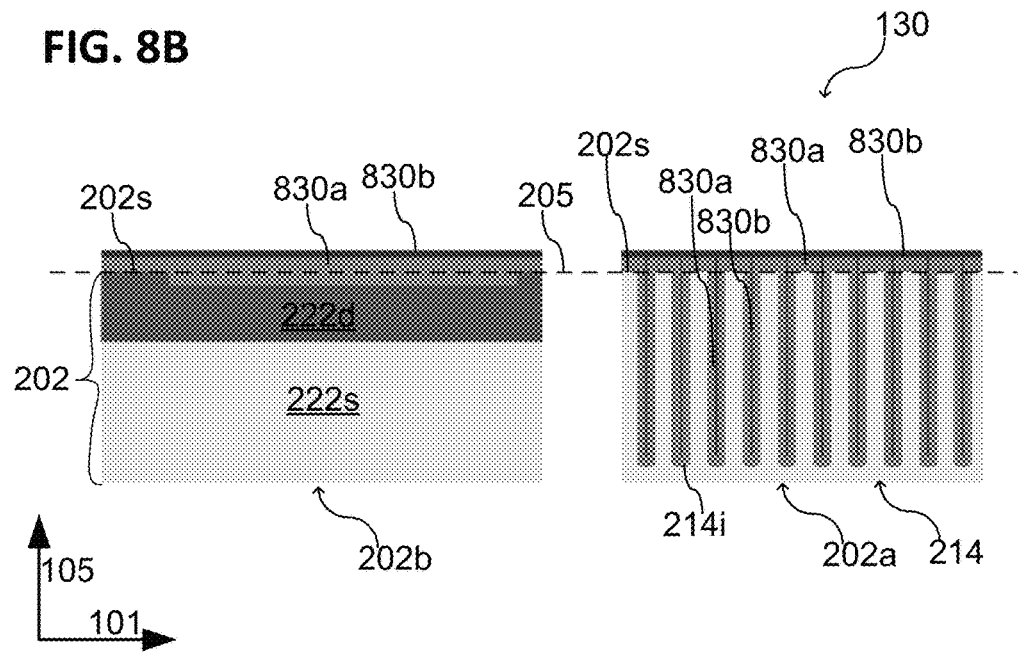

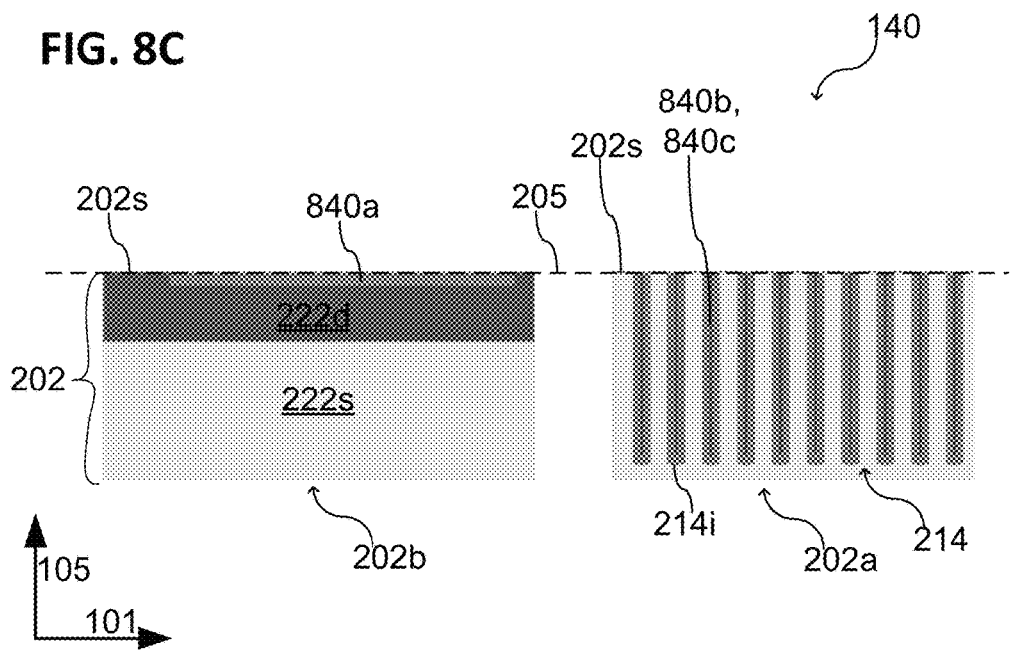
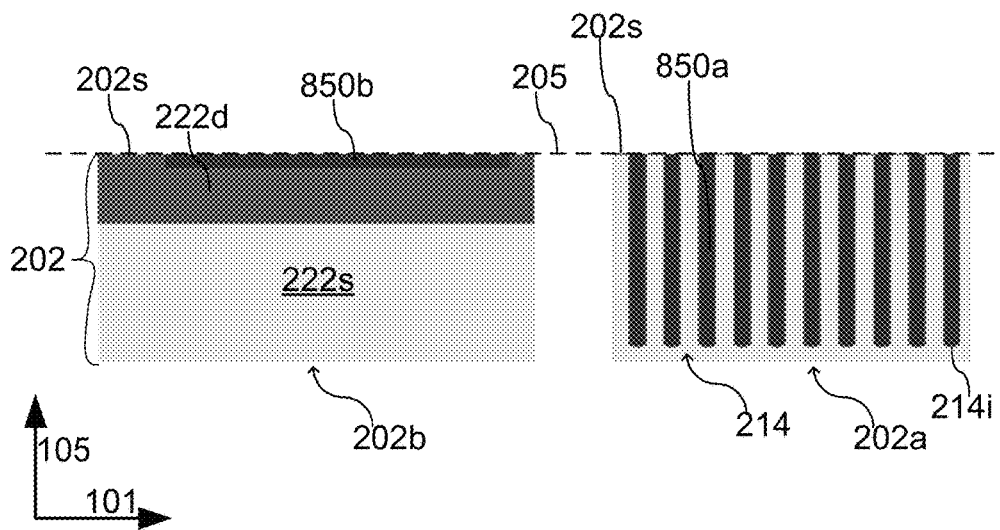

METHOD FOR PROCESSING A SEMICONDUCTOR WORKPIECE AND SEMICONDUCTOR DEVICE

CROSS-REFERENCE TO RELATED APPLICATION

This application claims priority to German Patent Application Serial No. 10 2017 106 020.0, which was filed on Mar. 21, 2017, and is incorporated herein by reference in its entirety and for all purposes.

TECHNICAL FIELD

Various embodiments relate generally to a method for processing a semiconductor workpiece and a semiconductor device.

BACKGROUND

In general, various different processes may be used in semiconductor industry for processing a semiconductor workpiece, e.g. for manufacturing a semiconductor device. A semiconductor workpiece, e.g. a die, a wafer, or any other suitable substrate, may be processed via layering, patterning, doping, annealing, and the like. For forming or processing trench structures, for example, a chemical mechanical polishing (CMP) process or any other suitable process may be used to planarize a surface of the semiconductor workpiece. Such a planarization may be difficult to be integrated into a process flow, since for example all structures extending above a planarization level are removed during planarization. This may conventionally lead to expensive and complex processing flows in the case that a planarization has to be considered, in particular, in the case that the planarization level reaches the main processing surface of the semiconductor workpiece, e.g. for forming a trench structure or the like within the semiconductor workpiece.

SUMMARY

According to various embodiments, a method for processing a semiconductor workpiece is provided, the method including: forming a trench structure in a first region of a semiconductor workpiece, the trench structure extending from a surface of the semiconductor workpiece into the semiconductor workpiece to a first depth; forming at least one recess in a second region of the semiconductor workpiece laterally next to the first region, the at least one recess extending from the surface of the semiconductor workpiece into the semiconductor workpiece to a second depth less than the first depth, depositing at least one material layer over the semiconductor workpiece, the at least one material layer filling the trench structure and the at least one recess and covering the surface of the semiconductor workpiece in the first region and in the second region. The method may further include planarizing the semiconductor workpiece to partially remove the at least one material layer in the first region and in the second region, wherein the at least one material layer remains in the trench structure and in the at least one recess.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows a schematic flow diagram of a method for processing a semiconductor workpiece, according to various embodiments;

FIGS. 2A to 2D show a semiconductor workpiece at various stages during processing, according to various embodiments;

FIGS. 5A to 5D show a semiconductor workpiece at various stages during processing, according to various embodiments;

FIGS. 6A and 6B show a semiconductor workpiece at various stages during processing, according to various embodiments;

FIGS. 7A to 7D show a semiconductor workpiece at various stages during processing, according to various embodiments;

FIGS. 8A to 8D show a semiconductor workpiece at various stages during processing, according to various embodiments;

DESCRIPTION

Figure 2A:
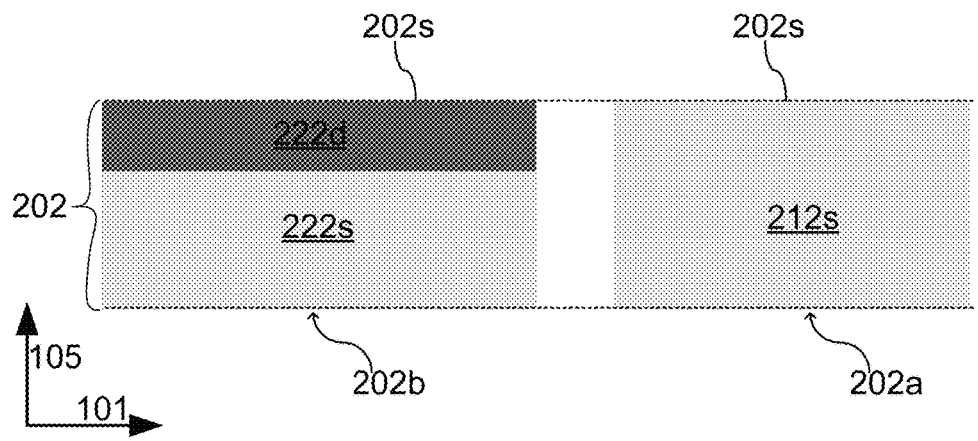

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments may be combined with one or more other embodiments to form new embodiments. Various embodiments are described in connection with methods and various embodiments are described in connection with devices. However, it may be understood that embodiments described in connection with methods may similarly apply to the devices, and vice versa.

The terms "at least one" and "one or more" may be understood to include any integer number greater than or equal to one, i.e. one, two, three, four, [. . . ], etc. The term "a plurality" may be understood to include any integer number greater than or equal to two, i.e. two, three, four, five, [. . . ], etc.

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The word "over", used herein to describe forming a feature, e.g. a layer "over" a side or surface, may be used to mean that the feature, e.g. the layer, may be formed "directly on", e.g. in direct contact with, the implied side or surface. The word "over", used herein to describe forming a feature, e.g. a layer "over" a side or surface, may be used to mean that the feature, e.g. the layer, may be formed "indirectly on" the implied side or surface with one or more additional layers being arranged between the implied side or surface and the formed layer.

In like manner, the word "cover", used herein to describe a feature disposed over another, e.g. a layer "covering" a side or surface, may be used to mean that the feature, e.g. the layer, may be disposed over, and in direct contact with, the implied side or surface. The word "cover", used herein to describe a feature disposed over another, e.g. a layer "covering" a side or surface, may be used to mean that the feature, e.g. the layer, may be disposed over, and in indirect contact with, the implied side or surface with one or more additional layers being arranged between the implied side or surface and the covering layer.

The term "lateral" used with regards to the "lateral" extension of a structure (or of a structure element) provided on or in a semiconductor work piece (e.g. a layer, a substrate, a wafer, or any other type of carrier) or "laterally" next to, may be used herein to mean an extension or a positional relationship along a surface of the carrier. That means that a surface of a semiconductor work piece (e.g. a layer, a substrate, a wafer, or any other type of carrier) may serve as reference, commonly referred to as the main processing surface. Further, the term "width" used with regards to a "width" of a structure (or of a structure element) may be used herein to mean the lateral extension of a structure. Further, the term "height" used with regards to a height of a structure (or of a structure element), may be used herein to mean an extension of a structure along a direction perpendicular to the surface of a carrier (e.g. perpendicular to the main processing surface of a carrier). The term "thickness" used with regards to a "thickness" of a layer may be used herein to mean the spatial extension of the layer perpendicular to the surface of the support (the material or material structure) on which the layer is deposited. If a surface of the support is parallel to the surface of the carrier (e.g. parallel to the main processing surface) the "thickness" of the layer deposited on the surface of the support may be the same as the height of the layer.

The term "coupled" is used herein to mean electrically connected, which may include a direct connection or an indirect connection, wherein an indirect connection may only include additional structures in the current path that not influence the substantial functioning of the described circuit or device. The term "electrically conductively connected" that is used herein to describe an electrical connection between two terminals, two contacts, etc. may be understood as an electrically conductive connection with ohmic behavior, e.g. provided by a metal or degenerate semiconductor in absence of p-n junctions in the current path. The term "contacted" that is used herein to describe an electrical contact between a terminal and a semiconductor region, or the like, may be understood as direct physical and/or direct electrical contact.

The term region used with regards to a "doped region", and the like, may be used herein to mean a continuous region with only one doping type (e.g. n-type or p-type).

According to various embodiments, a semiconductor workpiece (e.g. a semiconductor substrate, a semiconductor wafer, a semiconductor die, a deposited semiconductor layer, an epitaxial semiconductor layer, and the like) may be made of or may include silicon. However, other semiconductor materials of various types may be used in a similar way, e.g. germanium, Group III to V (e.g. SiC), or other types, including for example polymers. In an embodiment, the semiconductor layer is a wafer made of silicon (e.g. p-type doped or n-type doped). In an alternative embodiment, the semiconductor layer is a silicon on insulator (SOI) wafer.

According to various embodiments, for manufacturing MOS (metal oxide semiconductor) gated power devices a planarization (e.g. CMP, chemical mechanical polishing) may be used for the forming of a gate structure, e.g. including a gate material layer (e.g. a polysilicon layer) for partially or completely filling one or more gate trenches. The gate material layer may be partially removed during the planarization, i.e. outside the gate areas, or in other words, outside the trenches and/or at the upper surface of the semiconductor portion in which the one or more trenches are provided. Due to the planarization, the gate material layer may not be available for the formation of other functional structures, e.g. edge-termination field plates (e.g. including the same material as the gate material, e.g. including polysilicon) or for the formation of any other monolithically integrated device, as for example, a temperature sensor (e.g. a diode, a transistor, and/or a resistor), protective diode or protective bipolar junction transistor (BJT), a clamping diode, and the like.

As an example, an additional polysilicon layer may be deposited and structured (in other words patterned) in dedicated additional processing stages for the formation of polysilicon edge-termination field plates. Moreover, dedicated additional polysilicon field plate contact hole opening process stages may be used for the following reasons: use of deep-ultra-violet (DUV) lithography for IGBT (also referred to as insulated gate bipolar transistor, IGBT) contact hole lithography (with relatively small depth of focus). The additional polysilicon layer may induce a non-planar topography and the polysilicon edge-termination field plates may need contact holes lying in two different surface levels. These polysilicon edge-termination field plates related additional process stages may induce additional processing costs. Additionally, the interlayer dielectric may be thinned during conventional processing at the polysilicon layer edges and corners, which may cause reliability issues.

According to various embodiments, polysilicon edge-termination field plates may be formed during standard MOS gated device (e.g. a MOS gated IGBT) processing. Only layout changes may be needed by using the method described herein. According to various embodiments, one or more recessed surface areas may be etched in LOCOS (local oxidation of silicon) oxide at the edge-termination area during MOS gated device trench etch. Polysilicon field plates may be formed in these recessed surface areas following the gate polysilicon deposition and planarization. According to various embodiments, after forming the polysilicon field plate an interlayer dielectric deposition, a contact hole etch and a silicon groove etch may be carried out. The contact holes may be etched during standard processing since there is no surface topography due to the planarization that is performed after forming the one or more polysilicon field plates. In addition, the interlayer dielectric thinning at the edge of the field plates is prevented by using the method described herein.

Although the method, according to various embodiments, may be shown herein by reference to a polysilicon layer embedded in a dielectric layer, the method may be adapted and used for any suitable combination of materials for example using polysilicon/germanium instead of polysilicon or for example a metal instead of polysilicon.

More generally, polysilicon edge-termination field plates or the polysilicon layer for the monolithically integrated added functionality (e.g. devices, as for example, sensors, clamping diodes, etc., and/or edge-termination structures) may be formed during the standard MOS gated device processing with no or minor additional processing stages as follows:

i. The formation in defined areas of recessed surfaces (grooves or/and trenches for example). These recessed surface areas may be formed in different material than the MOS gated device trenches. They may have different geometry, shape and dimensions with respect to the MOS gated device trenches. They may be formed during one of standard MOS gated device processing stages (for example during the trench etch) or in dedicated additional processing stages.

ii. The polysilicon layer deposition and planarization for both the formation of the gate polysilicon in MOS gated device trenches and sensor or added functionality polysilicon in the areas defined above in (i).

iii. Subsequent processing for the formation in the polysilicon area formed as described in (i) and (ii) of sensors, added functionality structures, devices, and the like.

According to various embodiments, the gate polysilicon layer used as gate material and/or as material to provide added functionality structures may be doped in-situ during deposition or ex-situ after the deposition. The gate polysilicon can also be deposited with doping type (also referred to as dopant type) and/or doping level (also referred to as dopant concentration) variation throughout its thickness.

According to various embodiments, the method and the semiconductor device described herein may provide one, more than one, or all of the following advantages:

i. There may be no additional processing stages for the polysilicon edge-termination field plates or for a gate resistor integration for example in trench IGBT.

ii. The gate resistor may be smaller with respect to gate resistors made in conventional trenches. In addition, the resistor variability may be improved with respect to conventional resistor using conventional trenches, since the trench oxide hard mask etch may be etch end point controlled and the oxide etch rate during silicon trench etch may be relatively low. Moreover, a doping of the shallow resistor structure described herein may be easy to control.

iii. There may be less additional processing stages for the integration of other added functionality devices as the gate polysilicon is employed and no additional stages are needed for contact holes processing.

iv. No additional (polysilicon edge-termination field plates, gate resistor)/lower (added functionality devices) processing costs.

v. No added topography.

vi. No thinning of the inter-layer dielectric.

According to various embodiments, a process integration scheme for edge-termination structures, sensors and other integrated added functionalities is provided with no additional or minor additional processing stages. The proposed process integration schemes and semiconductor devices provided with the processing may be illustrated in more detail below. The formation of various semiconductor devices is described below in accordance with one or more different processing schemes. However, there may be various other possibilities or modifications of the processing schemes to form the semiconductor devices described herein. According to various embodiments, various standard processes of semiconductor processing may be used for processing the semiconductor workpiece and/or for manufacturing the respective semiconductor device, as for example, layering (e.g. using any suitable deposition process, e.g. a conformal deposition process), patterning (e.g. using any suitable patterning process, e.g. including a patterned hard mask or a patterned soft mask, and any suitable etch process, e.g. reactive ion etching, etc.), doping (e.g. using any suitable doping process, e.g. thermal diffusion and/or ion implantation, etc.), planarization (e.g. using any suitable planarization process, e.g. chemical mechanical polishing, etc.), annealing, and the like.

FIG. 1 illustrates a schematic flow diagram of a method 100 for processing a semiconductor workpiece, e.g. for manufacturing an electronic device, e.g. for manufacturing a semiconductor device, according to various embodiments.

The method 100 may include: in 110, forming a trench structure in a first region of a semiconductor workpiece, the trench structure extending from a surface of the semiconductor workpiece into the semiconductor workpiece to a first depth; in 120, forming a recess in a second region of the semiconductor workpiece laterally next to the first region, the recess extending from the surface of the semiconductor workpiece into the semiconductor workpiece to a second depth less than the first depth; in 130, forming at least one material layer over the semiconductor workpiece, the at least one material layer filling the trench structure and the recess and covering the surface of the semiconductor workpiece in the first region and in the second region; and, in 140, planarizing the semiconductor workpiece to partially remove the at least one material layer in the first region and in the second region, wherein the at least one material layer remains in the trench structure and in the recess.

In the following, the method 100 is described in more detail in various embodiments. FIGS. 2A to 2D show a semiconductor workpiece 202 at various stages during processing, e.g. during method 100 is carried out.

FIG. 2A illustrates the semiconductor workpiece 202 in a schematic cross-sectional view, e.g. at an initial processing stage before method 100 is carried out. The semiconductor workpiece 202 may include at least a first region 202a and a second region 202b or, in other words, at least two different types of regions 202a, 202b. The first region 202a of the semiconductor workpiece 202 may include for example a first semiconductor portion 212s. The first semiconductor portion 212s may define an upper surface (also referred to as main processing surface) 202s of the semiconductor workpiece 202. The second region 202b of the semiconductor workpiece 202 may include for example a second semiconductor portion 222s and a dielectric portion 222d disposed over the second semiconductor portion 222s. The first semiconductor portion 212s may define an upper surface (also referred to as main processing surface) 202s of the semiconductor workpiece 202. According to various embodiments, the first semiconductor portion 212s, e.g. the upper surface 202s, may define a planarization level 205. Illustratively, the surface 202s of the semiconductor workpiece 202 may be a planar surface 202s defined by the first semiconductor portion 212s of the first region 202a and the dielectric portion 222d of the second region 202b.

According to various embodiments, the dielectric portion 222d may be formed by a LOCOS process. Alternatively, the dielectric portion 222d (also referred to as dielectric layer) may be formed by any other suitable layering process.

According to various embodiments, the semiconductor workpiece 202 may be a semiconductor wafer including a plurality of first and second regions 202a, 202b. Illustratively, at least one first region 202a and at least one second region 202b may be provided in each chip region of the wafer, wherein the chip regions of the wafer may be laterally separated from each other via kerf regions. According to various embodiments, the first and second regions 202a, 202b may be arranged laterally next to each other. The first and second regions 202a, 202b may be directly adjacent to each other, or, alternatively, another region may be disposed between the first region 202a and the second region 202b (not illustrated). According to various embodiments, the semiconductor workpiece 202 may have a thickness (e.g. along the height direction 105) in the range from about several micrometers to about one millimeter. According to various embodiments, the semiconductor workpiece 202 may have a width (e.g. along the lateral direction 101) in the range from about several millimeters to about 50 cm, or even greater than 50 cm. According to various embodiments, the semiconductor workpiece 202 may include a semiconductor layer providing the semiconductor portions 212s, 222s disposed on any suitable carrier.

Figure 2B:
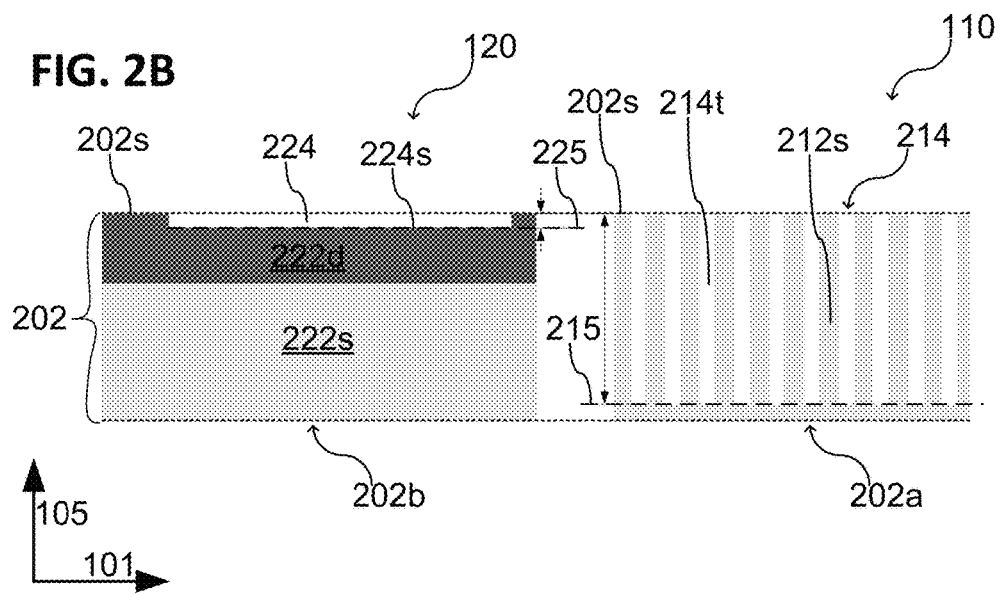

FIG. 2B illustrates the semiconductor workpiece 202 in a schematic cross-sectional view, e.g. at a processing stage after a trench structure 214 is formed (in 110) in the first region 202a and after a recess 224 is formed (in 120) in the second region 202b of the semiconductor workpiece 202.

According to various embodiments, the trench structure 214 may extend from the surface 202s of the semiconductor workpiece 202 into the semiconductor workpiece 202 to a first depth 215 (in other words to a first depth level). According to various embodiments, the recess 224 may extend from the surface 202s of the semiconductor workpiece 202 into the semiconductor workpiece 202 to a second depth 225 (in other words to a second depth level) less than the first depth 215. According to various embodiments, the first and second depth level may be arranged below the surface 202s (in other words below the surface level 205, see FIG. 2C) of the semiconductor workpiece 202.

As illustrated in FIG. 2B, the trench structure 214 may include a plurality of trenches 214t. Each trench 214t of the trench structure 214 may extend to the first depth 215. The trenches 214t of the trench structure 214 in the first region 202a may have first aspect ratio greater than a second aspect ratio of the recess 224 in the second region 202b. The aspect ratio of a structure element (e.g. of a recess or trench) may be defined by the depth (e.g. the extension along direction 105) divided by the width (e.g. the extension along direction 101 perpendicular to direction 105). According to various embodiments, the first aspect ratio of the trenches 214t of the trench structure 214 in the first region 202a may be greater than 1, e.g. greater than 5, e.g. greater than 10, or even greater. Further, the second aspect ratio of the recess 224 in the second region 202b may be less than 1, e.g. less than 0.5, e.g. less than 0.1, or even less.

As illustrated in FIG. 2B, the recess 224 in the second region 202b may have (e.g. in this processing stage may expose) a bottom surface 224s. According to various embodiments, the depth 225 of the recess 224 in the second region 202b may be less than the thickness (e.g. the extension along the direction 105) of the dielectric portion 222d. Therefore, the bottom surface is provided by dielectric material of the dielectric portion 222d.

According to various embodiments, the dielectric material of the dielectric portion 222d may include or may be an oxide (e.g. silicon oxide), and nitride (e.g. silicon nitride), an oxynitride (e.g. silicon oxynitride) or any other suitable dielectric material. According to various embodiments, the semiconductor material of the semiconductor portions 212s, 222s may include or may be silicon or any other suitable semiconductor material.

FIG. 2C illustrates the semiconductor workpiece 202 in a schematic cross-sectional view, e.g. at a processing stage after at least one material layer 230 is formed over the semiconductor workpiece 202 (in 130).

According to various embodiments, the at least one material layer 230 may fill (e.g. partially or completely) the trench structure 214 (or in other words the trenches 214t of the trench structure 214) and the at least one material layer 230 may fill the recess 224 (e.g. partially or completely). Further, the at least one material layer 230 may cover the surface 202s of the semiconductor workpiece 202 in the first region 202a and in the second region 202b. Illustratively, the at least one material layer 230 may cover the surface 202s of the semiconductor workpiece 202 outside the recess 224 and outside the trenches 214t of the trench structure 214. According to various embodiments, the at least one material layer 230 may be formed by a conformal deposition, e.g. by plasma-enhanced chemical vapor deposition, atomic layer deposition, or any other suitable conformal deposition technique.

According to various embodiments, both the trenches 214t of the trench structure 214 in the first region 202a and the recess 224 in the second region 202b may be filled with the same at least one material layer 230, i.e. the at least one material layer 230 may be deposited at the same time over both the first and second region 202a, 202b. To fill the trenches 214t of the trench structure 214 completely, e.g. via a conformal deposition process, the thickness of the at least one material layer 230 may be greater than half of the width of the trenches 214t, according to various embodiments. Further, to completely fill the recess 224 in the second region 202b with the same at least one material layer 230 as the trenches 214t in the first region 202a, the depth 225 of the recess 224 may be less than the thickness of the at least one material layer 230, e.g. less than half of the width of the trenches 214t. Alternatively, according to various embodiments, the trenches 214t of the trench structure 214 in the first region 202a and the recess 224 in the second region 202b may be filled with different materials, i.e. the at least one first material layer may be deposited over the first region 202a and at least one second material layer different from the at least one first material layer may be deposited over the second region 202b.

According to various embodiments, the at least one material layer 230 may be a single material layer including only one material. Alternatively, according to various embodiments, the at least one material layer 230 may include two or more material layers including two or more different materials.

FIG. 2D illustrates the semiconductor workpiece 202 in a schematic cross-sectional view, e.g. at a processing stage after the semiconductor workpiece 202 is planarized (in 140). According to various embodiments, the at least one material layer 230 may be partially removed by planarizing the semiconductor workpiece 202 at a first side 202f.

According to various embodiments, the at least one material layer 230 may be partially removed in the first region 202a and in the second region 202b, wherein first portions 240a of the at least one material layer 230 remain in the trench structure 214 (or, in other words, in the trenches 214t of the trench structure 214) and a second portion 240b of the at least one material layer 230 remains in the recess 224.

According to various embodiments, the surface 202s of the semiconductor workpiece 202 may be exposed after planarizing. The surface 202s of the semiconductor workpiece 202 may be provided in the first region 202a by the first semiconductor portion 212s and the filled trench structure 214 and in the second region 202b by the dielectric portion 222d and the filled recess 224. In other words, the planar surface 202s of the semiconductor workpiece 202 may be provided in the first region 202a by the first semiconductor portion 212s and the first portions 240a of the at least one material layer 230 remaining in the trench structure 214 and in the second region 202b by the dielectric portion 222d and by the second portion 240b of the at least one material layer 230 remaining in the filled recess 224.

According to various embodiments, the planarization process may remove all material from regions above the surface level 205 of the semiconductor workpiece 202. According to various embodiments, the upper surface of the at least one material layer 230 remaining in the filled recess 224 and the upper surface of the first semiconductor portion 121s in the first region 202a of the semiconductor workpiece 202 may be coplanar.

As illustrated in FIG. 2D in a schematic cross-sectional view, a semiconductor device 200 may be provided. According to various embodiments, the semiconductor device 200 may include a trench structure 214 in a first region 202a of a semiconductor workpiece 202, the trench structure 214 including a plurality of trenches 214t, each trench of the plurality of trenches 214t extends from a surface 202s of the semiconductor workpiece 202 into the semiconductor workpiece 202 to a first depth 215 and having a first width 211. Further, the semiconductor device 200 may include a recess 224 in a second region 202b of the semiconductor workpiece 202 (as illustrated for example in FIG. 2B, the second region 202b may be arranged laterally next to the first region 202a), the recess 224 extending from the surface 202s of the semiconductor workpiece 202 into the semiconductor workpiece 202 with a second depth 225 less than the first depth 215 and with a second width 221 greater than the first width 211. Further, the semiconductor device 200 may include at least one material layer 230 disposed in the plurality of trenches 214t and in the recess 224. Further, a portion of the surface 202s laterally outside of the trenches 214t and outside of the recess 224 is free of the at least one material layer 230.

According to various embodiments, the first width 211 of the trenches 214t of the trench structure 214 may be in the range from about 0.1 μm to about 2 μm. According to various embodiments, the second width 221 of the recess 224 may be in the range from about 2 μm to about 20 μm, or even greater than 20 μm, e.g. in the range from about 10 μm to about 100 μm. According to various embodiments, the first depth 215 of the trenches 214t of the trench structure 214 may be in the range from about 1 μm to about 5 μm, or even greater than 5 μm or less than 1 μm. According to various embodiments, the second depth 225 of the recess 224 may be in the range from about 0.1 μm to about 2 μm.

According to various embodiments, the portion 240b of the at least one layer 230 remaining in the recess 224 may be part of an added functionality structure (e.g. the portion 240b may include a semiconductor material to provide a region of a diode, a transistor, a sensor, a resistor, or the like, or, the portion 240b may include a metallic material to provide a part of a sensor, a resistor, and the like) and the trench structure in the first region may be part of a MOS gated device or any other trench based semiconductor device. Illustratively, the first region 202a may be an active cell area and the second region may be an added functionality area, according to various embodiments.

According to various embodiments, the at least one material layer 230 may be a gate polysilicon layer. Therefore, the planarization may be a gate polysilicon planarization.

According to various embodiments, a first insulating layer 214i may be formed in the first region 202a of the semiconductor workpiece 202 to separate the at least one material layer 240a remaining in the trench structure 214 from the first semiconductor portion 212s of the semiconductor workpiece 202 below the first insulating layer 214i. Further, the dielectric portion 222d may separate the at least one material layer 240b remaining in the recess 224 from the second semiconductor portion 222s of the semiconductor workpiece 202 below the dielectric portion 222d. In other words, the dielectric portion 222d may be a second insulating layer in the second region 202b of the semiconductor workpiece 202.

Figure 3A:
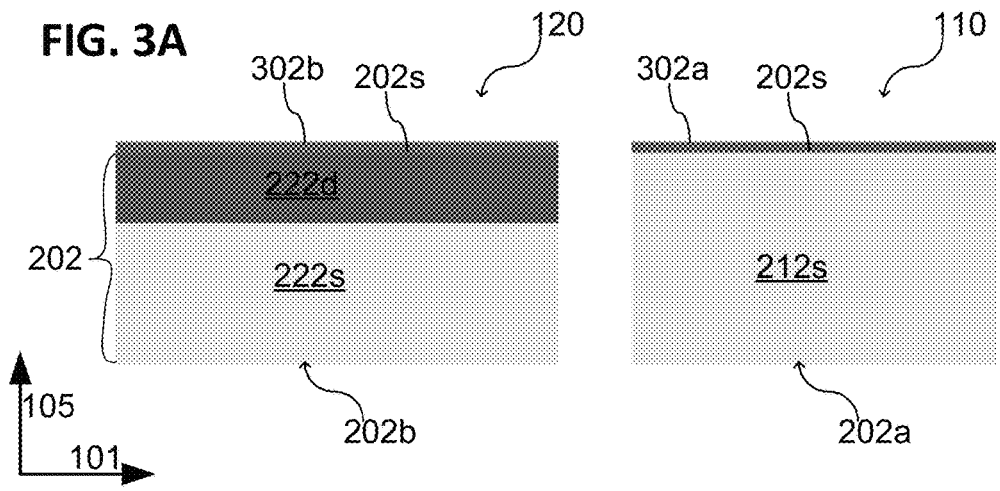
FIGS. 3A to 3C show a semiconductor workpiece at various stages during processing, according to various embodiments.
Figure 3B:
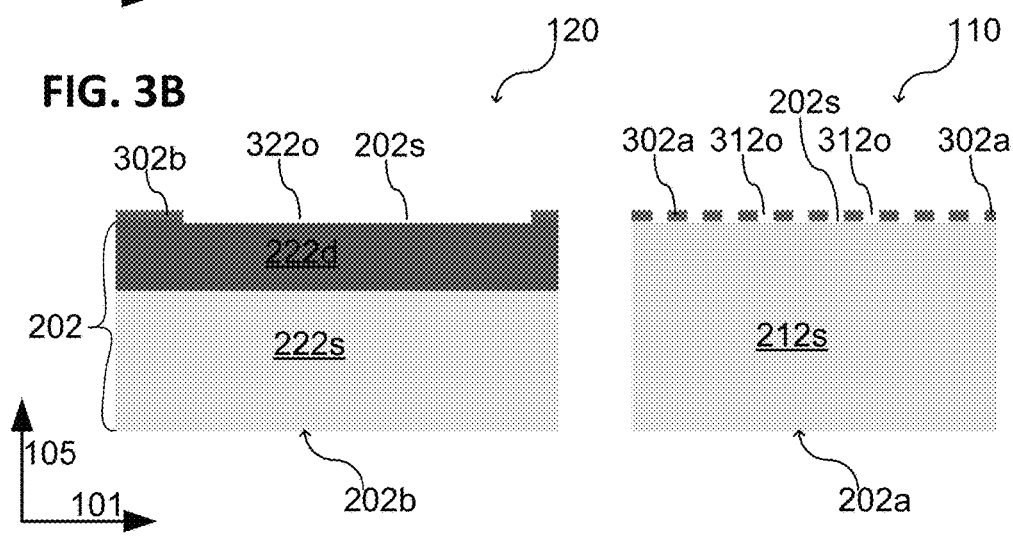
Figure 3C:
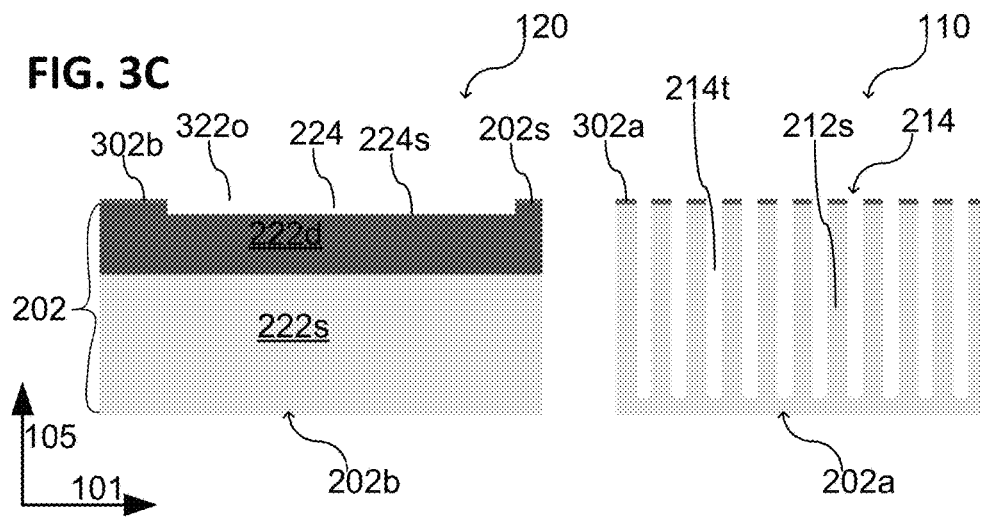

In the following, the method 100 described with reference to FIGS. 2A to 2D, may be described in more detail and/or modifications in various embodiments. FIGS. 3A to 3C show a semiconductor workpiece 202 at various stages during processing, e.g. during forming the trench structure 214 (in 110) and the recess 224 (in 120) of method 100.

FIG. 3A illustrates the semiconductor workpiece 202 in a schematic cross-sectional view, wherein a mask material layer 302a, 302b is formed over the surface 202s of the semiconductor workpiece 202.

According to various embodiments, a single mask material layer 302a, 302b may be used to cover the surface 202s of the semiconductor workpiece 202 in the first region 202a and in the second region 202b. In other words, the first semiconductor portion 212s of the first region 202a and the dielectric portion 222d of the second region 202b may be covered by a single mask material layer 302a, 302b. Alternatively, a first mask material layer 302a may be formed over the semiconductor workpiece 202 in the first region 202a, e.g. over the first semiconductor portion 212s of the first region 202a; and a second mask material layer 302b (different from the first mask material layer 302a) may be formed over the semiconductor workpiece 202 in the second region 202a, e.g. over the dielectric portion 222d of the second region 202b.

The mask material layer may be patterned to expose the surface 202s of the semiconductor workpiece 202 partially, as illustrated in FIG. 3B in a schematic cross-sectional view, according to various embodiments.

According to various embodiments, a plurality of first openings 312o may be provided in the mask material layer 302a to expose surface areas of the semiconductor workpiece 202 in the first region 202a, where the trenches 214t of the trench structure 214 is to be formed. Further, a second opening 322o may be provided in the mask material layer 302b to expose a surface area of the semiconductor workpiece 202 in the second region 202b, where the recess 224 is to be formed.

The mask material layer may be used to partially remove material of the semiconductor workpiece 202 to form the trench structure 214 in the first region 202a of the semiconductor workpiece 202 and to form the recess 224 in the second region 202b of the semiconductor workpiece 202, as illustrated in FIG. 3C in a schematic cross-sectional view, according to various embodiments. The dielectric material of the dielectric portion 222d may be for example silicon oxide and the semiconductor material of the first semiconductor portion 212s may be for example silicon (e.g. single crystalline silicon), so that the trenches 214t may be etched deeper into the semiconductor workpiece 202 than the recess 224. This may be achieved due to a different etch speed caused by the different materials to be etched.

Further, the remaining mask material layer 302a, 302b may be removed after the trench structure 214 and the recess 224 are formed, see FIG. 2B.

The mask material of the mask material layer 302a, 302b may be a soft mask material, e.g. a resist based material, which may be patterned by one or more lithographic processes. Alternatively, the mask material of the mask material layer 302a, 302b may be a hard mask material, e.g. a nitride based material (e.g. silicon nitride) or any other suitable hard mask material, which may be patterned by using a patterned soft mask layer and an etch process. According to various embodiments, the soft mask may be a photoresist mask.

According to various embodiments, the trench structure 214 and the recess 224 may be formed simultaneously, as for example illustrated in FIGS. 3A to 3C, e.g. by using a mask patterned material layer and an etch process, e.g. a dry etch process such as reactive ion etching.

Figure 4A:
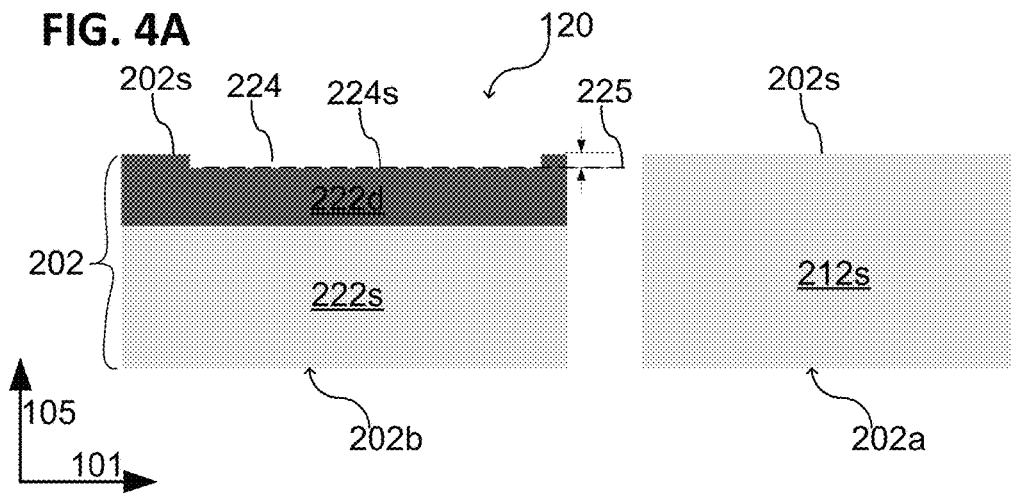
FIGS. 4A to 4C show a semiconductor workpiece at various stages during processing, according to various embodiments.
Figure 4B:
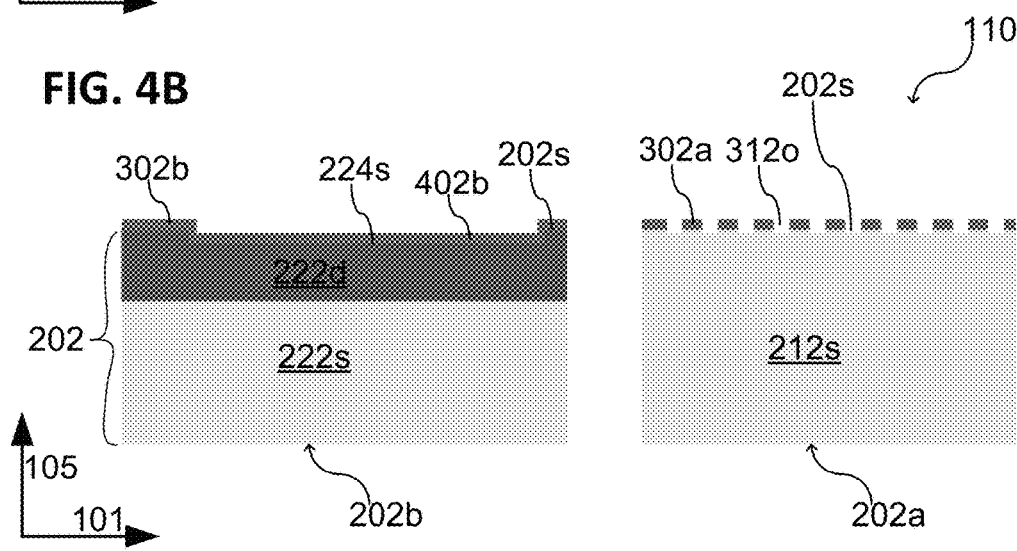
Figure 4C:
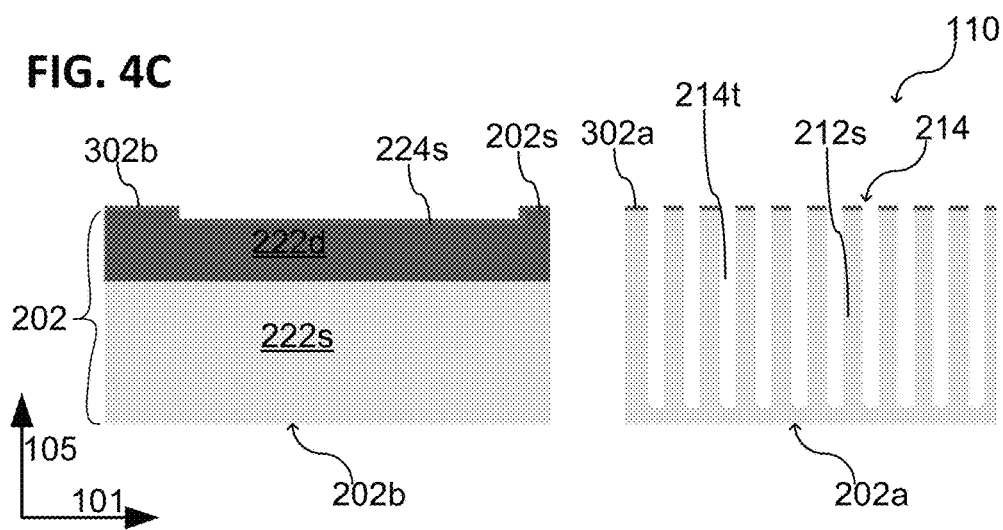

As an alternative, the recess 224 may be formed before the trench structure 214 is formed, as illustrated in FIGS. 4A to 4C.

FIG. 4A and FIG. 4B illustrate the semiconductor workpiece 202 in a schematic cross-sectional view, wherein the mask material layer 302a, 302b is formed over the surface 202s of the semiconductor workpiece 202 after the recess 224 is formed. Therefore, the mask material layer 302a, 302b may at least partially fill the recess 224. As illustrated in FIG. 4B, the mask material layer 302a may be patterned to partially expose the surface 202s of the semiconductor workpiece 202 in the first region 202a to form the trenches 214t of the trench structure 214, as described above and illustrated in FIG. 4C. During etching the trenches 214t, the mask material layer 302b may cover the semiconductor workpiece 202 in the second region completely. The mask material layer 302b may also cover the exposed sidewalls and bottom surface 224s of the recess 224. Further, the remaining mask material layer 302a, 302b may be removed (e.g. completely) after the trench structure 214 is formed, see FIG. 2B.

According to various embodiments, the dielectric portion 224d may be or may include a single layer or a layer stack with a plurality of layers. According to various embodiments, the trench hard mask formation may include for example deposition or growing (e.g. using an oven process such as silicon oxidation) the hard mask layer. Further, the trench hard mask structuring (also referred to as patterning) may include for example a photolithography and etch process. During hard mask etching, the substrate and the dielectric layer may be intentionally or unintentionally over-etched, according to various embodiments.

According to various embodiments, the photoresist mask may be formed by photolithography. Using the photoresist mask, the substrate and the dielectric (e.g. the semiconductor workpiece 202) may be patterned, e.g. via an etch process. The recess and the trench structure may be formed, for example, in at least one common etch process.

According to various embodiments, an etch sequence may be used to form the recess and the trench structure, wherein each etch process of the etch sequence may be either a selective etch process or a common etch process for example an etch sequence composed of a wet selective etch process of the dielectric and a common dry etch process.

According to various embodiments, the recess in the dielectric portion may be formed by photolithography and etching, before the trench structure is formed. Subsequently, a trench hard mask may be patterned for example using photolithography and etching. During the hard mask etching, the substrate may be intentionally or unintentionally over-etched. Alternatively, a soft mask may be used, e.g. patterned by photolithography.

In the following, the method 100 is described in more detail in various embodiments. FIGS. 5A to 5D show a semiconductor workpiece 202 at various stages during processing, e.g. during method 100 is carried out, in a similar way as described with reference to FIGS. 2A to 2D.

FIG. 5A illustrates the semiconductor workpiece 202 in a schematic cross-sectional view, during method 100 is carried out. The semiconductor workpiece 202 may include at least a first region 202a and a second region 202b or, in other words, at least two different types of regions 202a, 202b. The first region 202a of the semiconductor workpiece 202 may include for example a first semiconductor portion 212s. The first semiconductor portion 212s may define an upper surface (also referred to as main processing surface) 202s of the semiconductor workpiece 202. The second region 202b of the semiconductor workpiece 202 may include for example a second semiconductor portion 222s. Compared to the embodiments illustrated in FIGS. 2A to 2D, a dielectric portion 222d may be formed in the second region 202b of the semiconductor workpiece 202 after the recess 524 is formed in the second semiconductor portion 222s, as illustrated in FIG. 5B in a schematic cross-sectional view, according to various embodiments.

According to various embodiments, the first semiconductor portion 212s may define an upper surface (also referred to as main processing surface) 202s of the semiconductor workpiece 202. The first semiconductor portion 212s may define a planarization level.

Illustratively, first the surface 202s of the semiconductor workpiece 202 may be a planar surface 202s defined by the first semiconductor portion 212s of the first region 202a and the second semiconductor portion 222s of the second region 202b, as illustrated in FIG. 5A. After the recess 524 and the dielectric portion 222d are formed, the surface 202s of the semiconductor workpiece 202 may be a planar surface 202s defined by the first semiconductor portion 212s of the first region 202a and the dielectric portion 222d of the second region 202b, similar to the embodiments described above with reference to FIGS. 2A to 2D. The recess 524 and the dielectric portion 222d may be formed by patterning and layering.

Figure 5C:
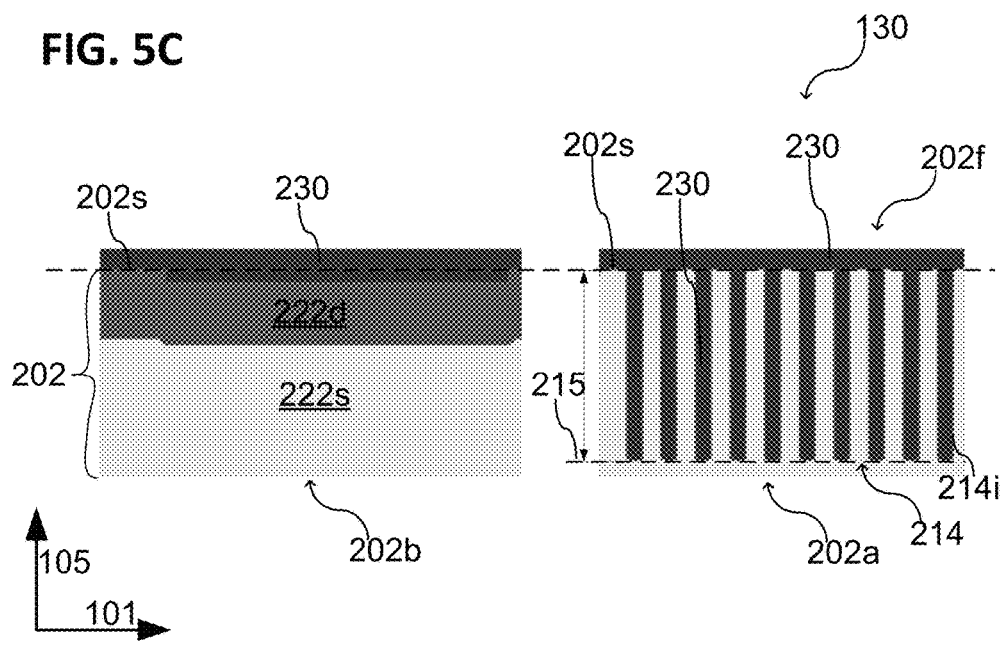

FIG. 5C illustrates the semiconductor workpiece 202 in a schematic cross-sectional view, e.g. at a processing stage after a trench structure 214 is formed in the first region 202a (in 110), after the recess 524 is formed in the second region 202b (in 120), and after at least one material layer 230 is formed over the semiconductor workpiece 202 at a first side 202f (in 130).

According to various embodiments, the trench structure 214 may extend from the surface 202s of the semiconductor workpiece 202 into the semiconductor workpiece 202 to a first depth 215 and the recess 524 may extend from the surface 202s of the semiconductor workpiece 202 into the semiconductor workpiece 202 to a second depth 225, as described above.

As illustrated in FIG. 5C, the trench structure 214 may include a plurality of trenches 214t. Each trench 214t of the trench structure 214 may extend to the first depth 215. The trenches 214t of the trench structure 214 in the first region 202a may have first aspect ratio greater than a second aspect ratio of the recess 524 in the second region 202b, as described above.

According to various embodiments, the dielectric material of the dielectric portion 222d may include or may be any suitable dielectric material, as described above. According to various embodiments, the semiconductor material of the semiconductor portions 212s, 222s may include or may be any suitable semiconductor material, as described above.

According to various embodiments, the at least one material layer 230 may fill (e.g. partially or completely) the trench structure 214 (or in other words the trenches 214t of the trench structure 214) and the at least one material layer 230 may fill the recess 524 (e.g. partially or completely), as described above. Further, the at least one material layer 230 may cover the surface 202s of the semiconductor workpiece 202 in the first region 202a and in the second region 202b. Illustratively, the at least one material layer 230 may cover the surface 202s of the semiconductor workpiece 202 outside the recess 524 and outside the trenches 214t of the trench structure 214. According to various embodiments, the at least one material layer 230 may be formed by any suitable conformal deposition technique, as described above.

According to various embodiments, the trenches 214t of the trench structure 214 in the first region 202a and the recess 524 in the second region 202b may be filled with the same at least one material layer 230, i.e. the at least one material layer 230 may be deposited at the same time over both the first and second region 202a, 202b, as described above. Alternatively, the trenches 214t of the trench structure 214 in the first region 202a and the recess 524 in the second region 202b may be filled with different materials, as described above.

According to various embodiments, the at least one material layer 230 may be a single material layer including only one material, as described above. Alternatively, according to various embodiments, the at least one material layer 230 may include two or more material layers including two or more different materials, as described above.

Figure 5D:
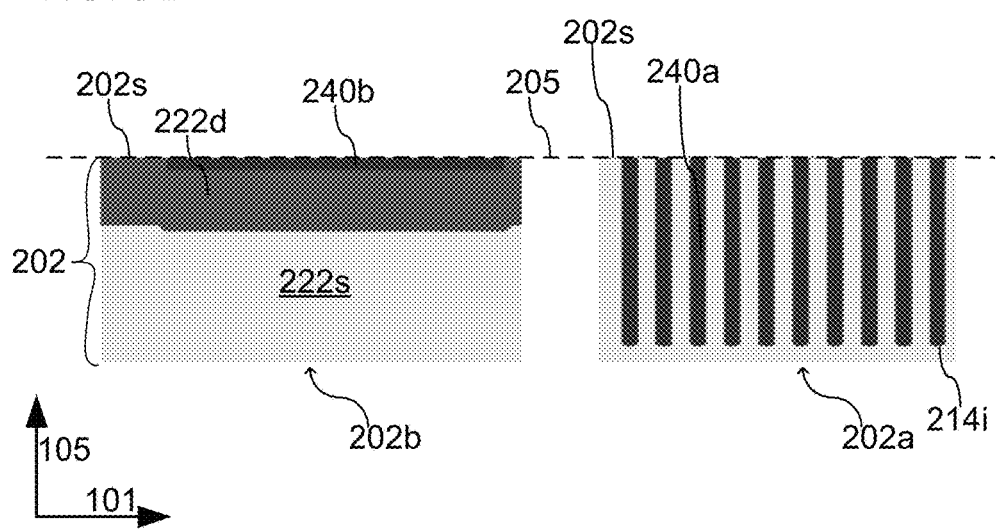

FIG. 5D illustrates the semiconductor workpiece 202 in a schematic cross-sectional view, e.g. at a processing stage after the semiconductor workpiece 202 is planarized (in 140). According to various embodiments, the at least one material layer 230 may be partially removed by planarizing the semiconductor workpiece 202 at a first side 202f, as described above.

According to various embodiments, the planar surface 202s of the semiconductor workpiece 202 may be provided in the first region 202a by the first semiconductor portion 212s and the first portions 240a of the at least one material layer 230 remaining in the trench structure 214 and in the second region 202b by the dielectric portion 222d and by the second portion 240b of the at least one material layer 230 remaining in the filled recess 524, as described above.

According to various embodiments, the planarization process may remove all material from regions above the surface level 205 of the semiconductor workpiece 202.

As illustrated in FIG. 5D in a schematic cross-sectional view, a semiconductor device 200 may be provided, similar to the semiconductor device 200 described with reference to FIG. 2D.

In the following, the method 100 described with reference to FIGS. 5A to 5D, may be described in more detail in various embodiments. FIGS. 6A and 6B show a semiconductor workpiece 202 at various stages during processing, e.g. during forming the trench structure 214 (in 110) and forming the recess (in 120) of method 100.

FIG. 6A and FIG. 6B illustrate the semiconductor workpiece 202 in a schematic cross-sectional view, wherein the mask material layer 302a, 302b is formed over the surface 202s of the semiconductor workpiece 202 after the recess 524 is formed. Therefore, the mask material layer 302a, 302b may at least partially fill the recess 524. As illustrated in FIG. 6A, the mask material layer 302a may be patterned to partially expose the surface 202s of the semiconductor workpiece 202 in the first region 202a to form the trenches 214t of the trench structure 214, as described above. During etching the trenches 214t, the mask material layer 302b may cover the semiconductor workpiece 202 in the second region completely. The mask material layer 302b may also cover the exposed sidewalls and bottom surface 524s of the recess 524. Further, the remaining mask material layer 302a, 302b may be removed (e.g. completely) after the trench structure 214 is formed.

According to various embodiments, the method 100 may include forming the dielectric portion 222d in the second region 202b of the semiconductor workpiece 202, as illustrated in FIG. 5B. The dielectric portion 222d may be formed by oxidation processes or by patterning (e.g. including etching) and layering processes (e.g. depositing a dielectric material).

In the following, the method 100 is described in more detail in various embodiments. FIGS. 7A to 7D show a semiconductor workpiece 202 at various stages during processing, e.g. during method 100 is carried out, in a similar way as described with reference to FIGS. 2A to 2D.

Figure 7A:
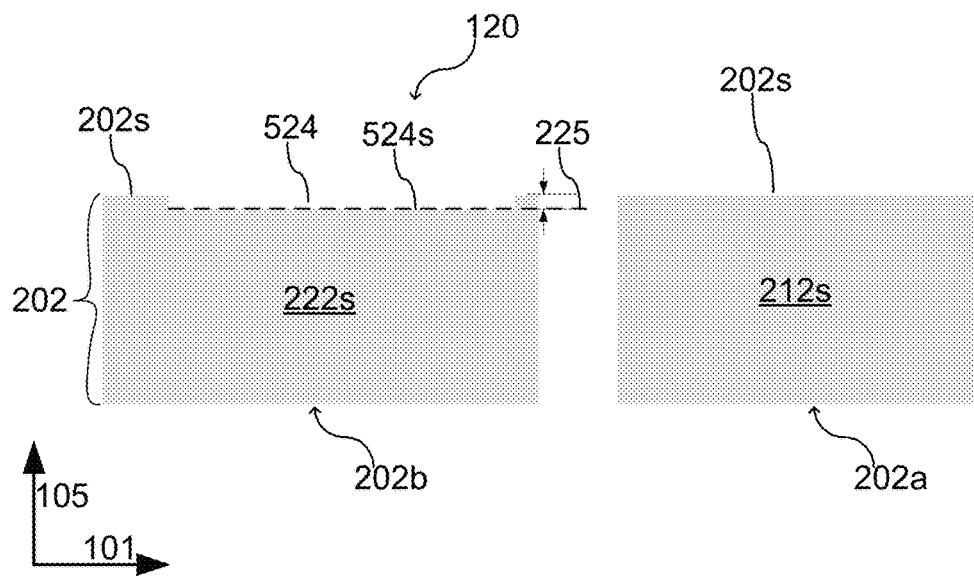
Figure 7B:
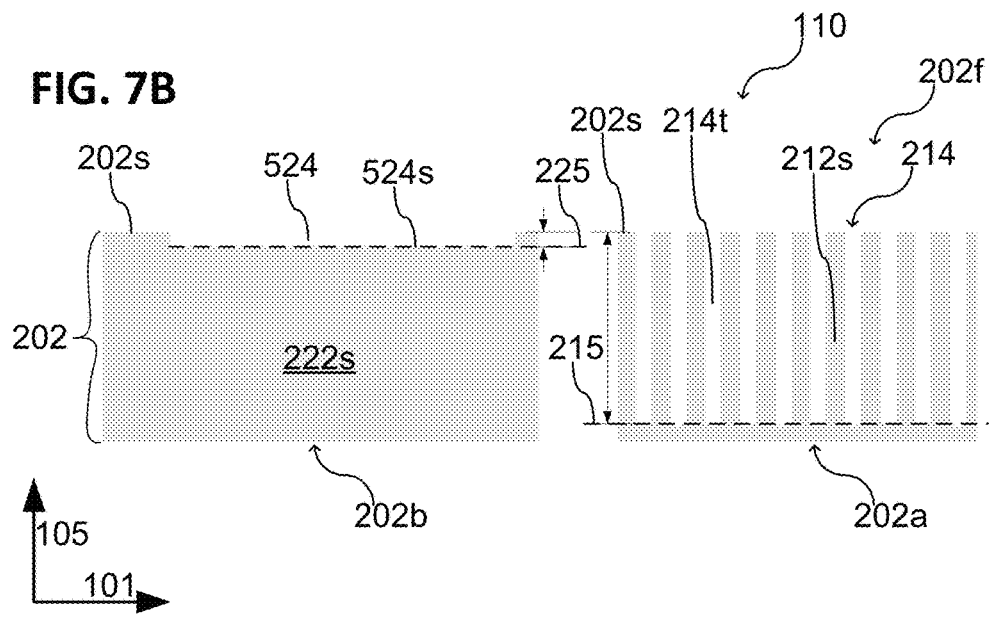

FIG. 7A illustrates the semiconductor workpiece 202 in a schematic cross-sectional view, during method 100 is carried out. The semiconductor workpiece 202 may include at least a first region 202a and a second region 202b or, in other words, at least two different types of regions 202a, 202b. The first region 202a of the semiconductor workpiece 202 may include for example a first semiconductor portion 212s. The first semiconductor portion 212s may define an upper surface (also referred to as main processing surface) 202s of the semiconductor workpiece 202. The second region 202b of the semiconductor workpiece 202 may include for example a second semiconductor portion 222s. Compared to the embodiments illustrated in FIGS. 2A to 2D and FIGS. 5A to 5D, the trench structure 214 is formed in the first semiconductor portion 212s in the first region and the recess 524 is formed in the second semiconductor portion 222s in the second region, as illustrated in FIG. 7B in a schematic cross-sectional view, according to various embodiments.

According to various embodiments, the first semiconductor portion 212s may define an upper surface (also referred to as main processing surface) 202s of the semiconductor workpiece 202. The first semiconductor portion 212s may define a planarization level.

Illustratively, first the surface 202s of the semiconductor workpiece 202 may be a planar surface 202s defined by the first semiconductor portion 212s of the first region 202a and the second semiconductor portion 222s of the second region 202b, as illustrated in FIG. 7A.

FIG. 7C illustrates the semiconductor workpiece 202 in a schematic cross-sectional view, e.g. at a processing stage after a trench structure 214 is formed in the first region 202a (in 110), after the recess 524 is formed in the second region 202b (in 120), and after at least one material layer 230 is formed over the semiconductor workpiece 202 at a first side 202f (in 130).

According to various embodiments, the trench structure 214 may extend from the surface 202s of the semiconductor workpiece 202 into the semiconductor workpiece 202 to a first depth 215 and the recess 524 may extend from the surface 202s of the semiconductor workpiece 202 into the semiconductor workpiece 202 to a second depth 225, as illustrated in FIG. 7B and described above.

According to various embodiments, the dielectric material of the first dielectric layer 214i and the second dielectric layer 724i may include or may be any suitable dielectric material, e.g. an oxide, or a nitride. According to various embodiments, an oxide/nitride layer stack may be used as dielectric layer, e.g. a silicon oxide/silicon nitride layer stack.

According to various embodiments, the semiconductor material of the semiconductor portions 212s, 222s may include or may be any suitable semiconductor material, as described above.

According to various embodiments, the at least one material layer 230 may fill (e.g. partially or completely) the trench structure 214 (or in other words the trenches 214t of the trench structure 214) and the at least one material layer 230 may fill the recess 524 (e.g. partially or completely), as described above. Further, the at least one material layer 230 may cover the surface 202s of the semiconductor workpiece 202 in the first region 202a and in the second region 202b. Illustratively, the at least one material layer 230 may cover the surface 202s of the semiconductor workpiece 202 outside the recess 524 and outside the trenches 214t of the trench structure 214. According to various embodiments, the at least one material layer 230 may be formed by any suitable conformal deposition technique, as described above.

According to various embodiments, the trenches 214t of the trench structure 214 in the first region 202a and the recess 524 in the second region 202b may be filled with the same at least one material layer 230, i.e. the at least one material layer 230 may be deposited at the same time over both the first and second region 202a, 202b, as described above. Alternatively, the trenches 214t of the trench structure 214 in the first region 202a and the recess 224 in the second region 202b may be filled with different materials, as described above.

According to various embodiments, the at least one material layer 230 may be a single material layer including only one material, as described above. Alternatively, according to various embodiments, the at least one material layer 230 may include two or more material layers including two or more different materials, as described above.

FIG. 7D illustrates the semiconductor workpiece 202 in a schematic cross-sectional view, e.g. at a processing stage after the semiconductor workpiece 202 is planarized (in 140). According to various embodiments, the at least one material layer 230 may be partially removed by planarizing the semiconductor workpiece 202 at a first side 202f, as described above.

According to various embodiments, the planar surface 202s of the semiconductor workpiece 202 may be provided in the first region 202a by the first semiconductor portion 212s and the first portions 240a of the at least one material layer 230 remaining in the trench structure 214 and in the second region 202b by the dielectric portion 222d and by the second portion 240b of the at least one material layer 230 remaining in the filled recess 224, as described above. According to various embodiments, the planarization process may remove all material from regions above the surface level 205 of the semiconductor workpiece 202.

As illustrated in FIG. 7D in a schematic cross-sectional view, a semiconductor device 200 may be provided, similar to the semiconductor device 200 described with reference to FIG. 2D and FIG. 5D.

In this case, a dielectric layer 214i may be formed, e.g. optionally, over the semiconductor workpiece 202 from the first side 202f, after the trench structure 214 and the recess 524 are formed, see FIG. 7C and before the trench structure 214 and the recess 524 are filled with the at least one material layer 230. According to various embodiments, a first insulating layer 214i may be formed in the first region 202a of the semiconductor workpiece 202 to separate the at least one material layer 240a remaining in the trench structure 214 from the first semiconductor portion 212s of the semiconductor workpiece 202 below the first insulating layer 214i. Further, according to various embodiments, a second insulating layer 724i (similar to the dielectric portion 222d described above) may be formed in the second region 202b of the semiconductor workpiece 202 to separate the at least one material layer 240b remaining in the recess 524 from the second semiconductor portion 222s of the semiconductor workpiece 202 below the second insulating layer 724i, as shown in FIG. 7D.

Illustratively, the dielectric portion 222d shown for example in FIGS. 2D and 5D may be a dielectric layer 724i, or in other words, a dielectric layer 724i may be used instead of the dielectric portion 222d.

According to various embodiments, the dielectric layer 214i in the trenches 214t may have thickness in the range from about 1 nm to about 10 nm, or even more than 10 nm, e.g. in the range from about 1 nm to about 100 nm. The dielectric layer 724i in the recess 524 may have thickness in the range from about 1 nm to about 10 nm, or even more than 10 nm, e.g. in the range from about 1 nm to about 100 nm. According to various embodiments, the dielectric layer 214i, 724i in the trenches 214t and in the recess 524 may be formed by the same layering process, e.g. by thermal oxidation of the semiconductor material in the first region and in the second region. However, other layering processes may be used as well, e.g. chemical or physical vapor deposition.

According to various embodiments, the at least one material layer 230 may include at least two material layers, e.g. a first material layer and a second material layer. The first material layer may include or may be a semiconductor layer doped with a dopant of a first doping type (e.g. n-type or p-type) and a first dopant concentration (e.g. very lowly doped (n, p), doped (n+, p+), highly doped (n++, p++)), or degenerately doped and a second material layer may include or may be a semiconductor layer doped with a dopant of the first doping type (e.g. n-type or p-type) or a second doping type opposite the first doping type and the first dopant concentration or a second dopant concentration different from the first dopant concentration.

In the following, the method 100 described with reference to FIGS. 2A to 7D, may be described in more detail in various embodiments. FIGS. 8A to 8D show a semiconductor workpiece 202 at various stages during processing.

FIG. 8A illustrates the semiconductor workpiece 202 in a schematic cross-sectional view, e.g. at a starting point after the trench structure 214 and the recess 524 are formed and before the trench structure 214 and the recess 524 are filled with the at least one material layer 230, as described above.

FIG. 8B illustrates the semiconductor workpiece 202 in a schematic cross-sectional view, e.g. after at least two material layers 830a, 830b are formed over the semiconductor workpiece 202 from the first side 202f. According to various embodiments, the trench structure 214 and the recess 524 may be filled with the one or two materials of the at least two material layers 830a, 830b.

According to various embodiments, using more than one material layer with adapted thicknesses relative to each other may allow to fill, for example, the recess with a first semiconductor material having a first dopant concentration and filling the trenches 214t of the trench structure 214 with a second semiconductor material having a second dopant concentration a different from the first dopant concentration (e.g. higher than the first dopant concentration).

As illustrated in FIG. 8B, the first material layer 830a may fill the recess 224 completely and the trenches 214t only partially. The second material layer 830b may be deposited over the first material layer 830a, and fill a remaining space in the trenches 214t. Therefore, the trenches 214t may be filled with both, the first material layer 830a and the second material layer 830b.

FIG. 8C illustrates the semiconductor workpiece 202 in a schematic cross-sectional view, e.g. at a processing stage after the semiconductor workpiece 202 is planarized (in 140). According to various embodiments, the at least two material layers 830a, 830b may be partially removed by planarizing the semiconductor workpiece 202 at a first side 202f, as described above.

After planarizing, only a portion 840a of the first material layer 830a may be disposed in the second region 202b of the semiconductor workpiece 202, e.g. filling the recess 224. Further, a portion 840b of the first material layer 830a and a portion 840c of the second material layer 830b may be disposed in the first region 202a of the semiconductor workpiece 202, e.g. filling the trenches 214t of the trench structure 214.

FIG. 8D illustrates the semiconductor workpiece 202 in a schematic cross-sectional view, e.g. at a processing stage after the semiconductor workpiece 202 is annealed. According to various embodiments, the annealing may include rapid thermal annealing using a laser, a lamp or any other suitable heater structure. The annealing may both, activate the dopant in the semiconductor material filling the recess 224 and the trenches 214t, and homogenously distribute the dopant in the semiconductor material filling the trenches 214t. Therefore, if the first material layer 830a includes semiconductor material with a less dopant concentration than the second material layer 830b, the semiconductor material 850a filling the trenches 214t may finally have a higher dopant concentration than the semiconductor material 850b filling the recess 224. This allows forming, for example, a low doped polysilicon portion 850b in the recess 224 and forming a higher doped polysilicon portion 850a in the trenches 214t. Accordingly, a MOS gated device may be formed in the first (e.g. active cell) region 202a and an edge-termination structure, a sensor, or an added functionality structure may be formed in the second region 202b of the semiconductor workpiece 202.

According to various embodiments, the gate material layer (e.g. a gate polysilicon layer) 240a, 850a may be doped in-situ during deposition or ex-situ after the deposition. The gate material layer can also be deposited with doping type and/or doping level variation throughout its thickness. As illustrated in FIGS. 8A to 8D as an example, the gate material layer may be deposited with doping level and/or doping type variations. After planarization of the gate material layer, a drive in of the dopant may be carried out.

According to various embodiments, an edge-termination structure may be formed in the second region 202b of the semiconductor workpiece 202, wherein, for example, a semiconductor power structure (e.g. a trench gated field-effect transistor or a trench gated insulated gate bipolar transistor, etc.) is formed in the first region 202a of the semiconductor workpiece 202, as described in more detail below.

Figure 9A:
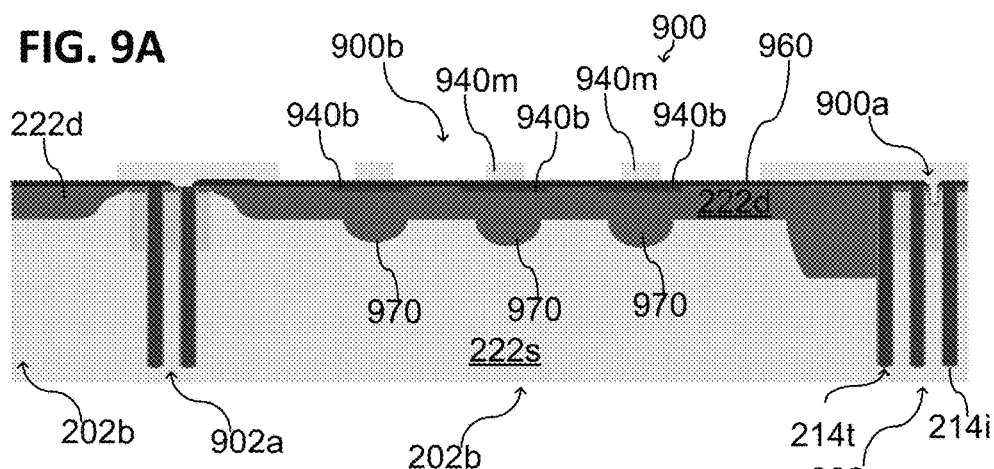
FIGS. 9A to 9D respectively show a semiconductor device including a semiconductor workpiece in a schematic cross-sectional view, according to various embodiments.

FIG. 9A shows a semiconductor device 900 including a semiconductor workpiece 202 in a schematic cross-sectional view, according to various embodiments. According to various embodiments, a trench based semiconductor structure 900a is provided in the first region 202a of the semiconductor workpiece 202. The trenches 214t of the trench based semiconductor structure 900a may be formed as described above. Further, according to various embodiments, an edge-termination structure 900b may be provided in the second region 202b of the semiconductor workpiece 202.

The edge-termination structure 900b may be located along a transistor perimeter or a die edge for a trench based MOSFET or other semiconductor structure 900a. The edge-termination structure 900b may include one or more polysilicon field plates 940b. The polysilicon field plates 940b of the edge-termination structure 900b may be formed as described above with reference to the portion 240b, 850b of the at least one material layer 230, 830a, 830b remaining in the recess 224 in the second region 202b of the semiconductor workpiece 202. Therefore, a plurality of recesses may be formed laterally next to each other, or, alternatively, the portion 240b, 850b of the at least one material layer 230, 830a, 830b remaining in the recess 224 may be patterned and filled up again with dielectric material.

The semiconductor device 900 may include one or more metal contacts 940m for contacting the polysilicon field plates 940b. Further, an additional trench structure 902a may be provided laterally next to the edge-termination structure 900b. The additional trench structure 902a may be formed in the same way or in a similar way as described above for the trench structure 214 in the first region 202a of the semiconductor workpiece 202.

According to various embodiments, one or more trenches may be also part of the edge-termination structure 900b, e.g. one or more trenches lined with a dielectric layer and filled with polysilicon.

According to various embodiments, the edge-termination structure 900b may include doped regions 970 formed in the semiconductor portion 222s in the second region 202b of the semiconductor workpiece 202. The doped regions 970 may be field rings 970 of the edge-termination structure 900b. Each of the polysilicon field plates 940b may be connected (e.g. in the third dimension that is not illustrated) to the corresponding field ring 970 located below the respective polysilicon field plate 940b. The polysilicon field plates 940b and the field rings 970 may be connected to each other by a metal.

According to various embodiments, a further dielectric layer 960 may be disposed between the polysilicon field plates 940b and the one or more metal contacts 940m.

According to various embodiments, a standard MOS gated power device processing as described for example in FIGS. 2A to 6B may be employed with no additional processing steps. Only layout modifications may be performed to form the desired structures during standard processing.

Figure 9B:
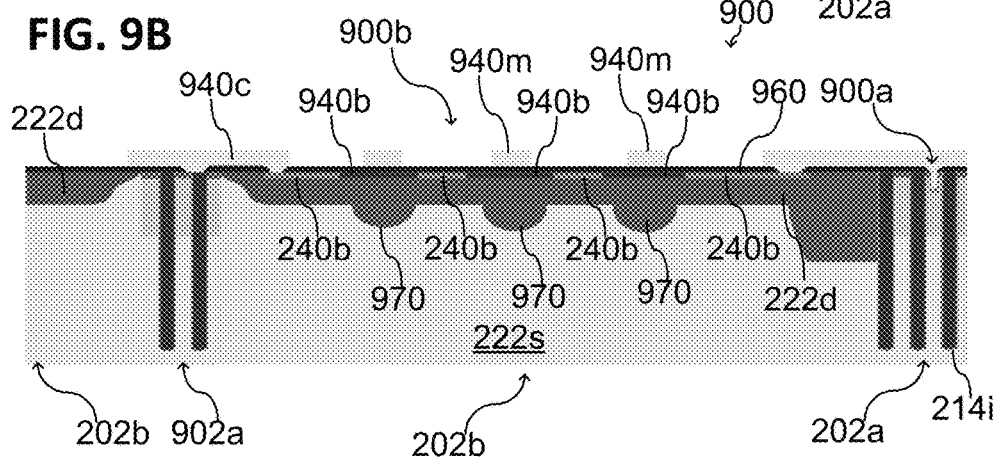

FIG. 9B shows a semiconductor device 900 including a semiconductor workpiece 202 in a schematic cross-sectional view, according to various embodiments. According to various embodiments, a trench based semiconductor structure 900a is provided in the first region 202a of the semiconductor workpiece 202. The trenches 214t of the trench based semiconductor structure 900a may be formed as described above. Further, according to various embodiments, an edge-termination structure 900b may be provided in the second region 202b of the semiconductor workpiece 202, as described above, e.g. with reference to FIG. 9A.

As illustrated in FIG. 9B, the edge-termination structure 900*b* may include field rings 970 and polysilicon field plates 940*b*, as described above. Further, the polysilicon field plates 940*b* may be laterally surrounded by an edge-termination polysilicon layer 240*b*. The edge-termination polysilicon layer 240*b* may be lower doped than the polysilicon field plates 940*b*. The polysilicon field plates 940*b* and the edge-termination polysilicon layer 240*b* may be formed as described above with reference to the portion 240*b*, 850*b* of the at least one material layer 230, 830*a*, 830*b* remaining in the recess 224 in the second region 202*b* of the semiconductor workpiece 202. Therefore, the portion 240*b*, 850*b* of the at least one material layer 230, 830*a*, 830*b* may be doped (e.g. using a patterned doping mask) to form the polysilicon field plates 940*b* in the edge-termination polysilicon layer 240*b*.

According to various embodiments, the edge-termination polysilicon layer 240*b* may be electrically contacted via an additional metal contact 940*c*.

According to various embodiments, a MOS gated power device 900*a* may be formed in the first region 202*a* of the semiconductor workpiece 202, e.g. with layout modifications and some processing modifications. The gate polysilicon filling the trenches of the MOS gated power device 900*a* (e.g. the gate material of the MOS gated power device 900*a*) may be formed (e.g. deposited) with a doping level higher (or alternatively lower) than or equal to the doping level of the edge-termination polysilicon of the edge-termination polysilicon layer 240*b*. The edge-termination polysilicon layer 240*b* may be protected during the doping of the gate polysilicon and the doping of the polysilicon of the field plates 940*b* (both gate polysilicon and field plate polysilicon may be doped during the same doping process). The edge-termination polysilicon may be doped without masking in one or more dedicated processes to the desired doping type and doping level in the case that the as deposited polysilicon doping type and/or doping level is not suitable (opposite doping of the field plate polysilicon and the edge-termination polysilicon may allow to reduce low temperature leakage current). In other words, the field plate polysilicon of the field plates 940*b* may be doped oppositely to the edge-termination polysilicon of the edge-termination polysilicon layer 240*b*.

According to various embodiments, the edge-termination polysilicon may have the same function as an edge-termination amorphous silicon, which may be deposited on a metal and may be only protected by a passivation stack. However, the proposed edge-termination polysilicon as it is protected by the interlayer dielectric of the dielectric layer 960 may have an improved robustness.

Figure 9C:
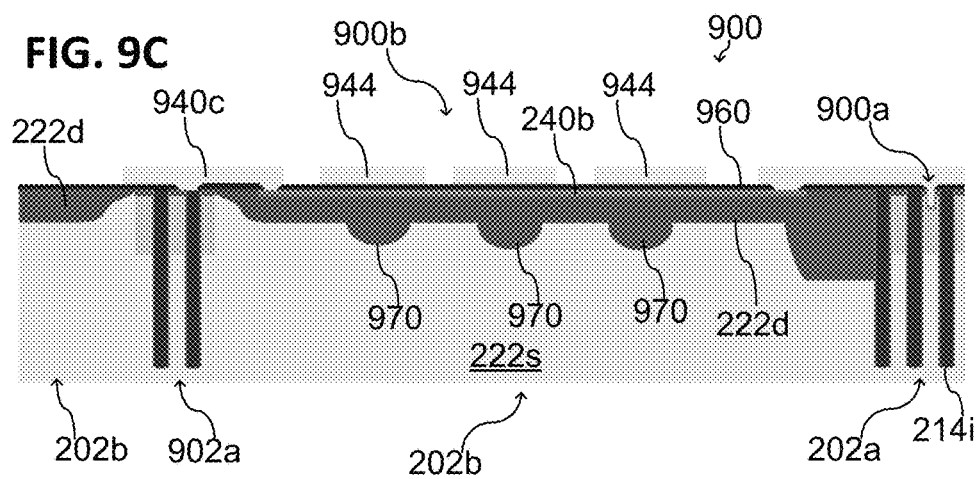

FIG. 9C shows a semiconductor device 900 including a semiconductor workpiece 202 in a schematic cross-sectional view, according to various embodiments. According to various embodiments, a trench based semiconductor structure 900*a* is provided in the first region 202*a* of the semiconductor workpiece 202. The trenches 214*t* of the trench based semiconductor structure 900*a* may be formed as described above. Further, according to various embodiments, an edge-termination structure 900*b* may be provided in the second region 202*b* of the semiconductor workpiece 202, as described above, e.g. with reference to FIG. 9A or FIG. 9B.

According to various embodiments, the edge-termination structure 900*b* may include field rings 970, metal field plates 944 and an edge-termination polysilicon layer 240*b*. The edge-termination polysilicon layer 240*b* may have a higher resistivity (e.g. a lower doping concentration) as the gate polysilicon. Each of the metal field plates may be connected (e.g. in the third dimension not illustrated in FIG. 9C) to both the respective field ring 970 and the edge-termination polysilicon 240*b*.

According to various embodiments, a MOS gated power device 900*a* may be formed in the first region 202*a* of the semiconductor workpiece 202, e.g. with layout modifications and some processing modifications. The gate polysilicon filling the trenches of the MOS gated power device 900*a* (e.g. the gate material of the MOS gated power device 900*a*) may be formed (e.g. deposited) with a doping level higher (or alternatively lower) than or equal to the doping level of the edge-termination polysilicon of the edge-termination polysilicon layer 240*b*. The edge-termination polysilicon layer 240*b* may be protected during the doping of the gate polysilicon. The edge-termination polysilicon may be doped without masking in one or more dedicated processes to the desired doping type and doping level in the case that the as deposited polysilicon doping type and/or doping level is not suitable. For example, the edge-termination polysilicon may be doped to the doping type and doping level for which the Schottky-barrier to the contact metal 940*c* is higher, which may allow to reduce a low temperature leakage current.

According to various embodiments, the edge-termination polysilicon and the gate polysilicon may be formed and doped as described with reference to FIGS. 8A to 8D.

According to various embodiments, the edge-termination polysilicon may have the same function as an edge-termination amorphous silicon, which may be deposited on a metal and may be only protected by a passivation stack. However, the proposed edge-termination polysilicon as it is protected by the interlayer dielectric of the dielectric layer 960 may have an improved robustness.

Figure 9D:
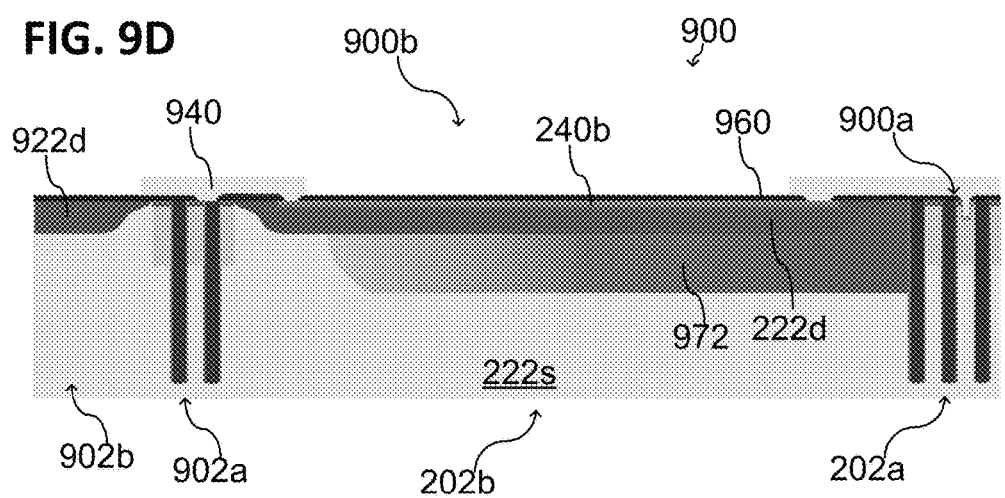

FIG. 9D shows a semiconductor device 900 including a semiconductor workpiece 202 in a schematic cross-sectional view, according to various embodiments. According to various embodiments, a trench based semiconductor structure 900*a* is provided in the first region 202*a* of the semiconductor workpiece 202. The trenches 214*t* of the trench based semiconductor structure 900*a* may be formed as described above. Further, according to various embodiments, an edge-termination structure 900*b* may be provided in the second region 202*b* of the semiconductor workpiece 202, as described above, e.g. with reference to FIGS. 9A to FIG. 9C.

According to various embodiments, the edge-termination structure 900*b* may include a Variable Lateral Doping (VLD) 972 or Junction Termination Extension (JTE) 972. Further, the edge-termination structure 900*b* may include an edge-termination polysilicon layer 240*b*. The edge-termination polysilicon layer 240*b* may have a higher resistivity (e.g. a lower doping) than the gate polysilicon.

According to various embodiments, a MOS gated power device 900*a* may be formed in the first region 202*a* of the semiconductor workpiece 202, e.g. with layout modifications and some processing modifications. The gate polysilicon filling the trenches of the MOS gated power device 900*a* (e.g. the gate material of the MOS gated power device 900*a*) may be formed (e.g. deposited) with a doping level higher (or alternatively lower) than or equal to the doping level of the edge-termination polysilicon of the edge-termination polysilicon layer 240*b*. The edge-termination polysilicon layer 240*b* may be protected during the doping of the gate polysilicon. The edge-termination polysilicon may be doped without masking in one or more dedicated processes to the desired doping type and doping level in the case that the as deposited polysilicon doping type and/or doping level is not suitable. For example, the edge-termination polysilicon may be doped to the doping type and doping level for which the Schottky-barrier to the contact metal 940c is higher, which may allow to reduce a low temperature leakage current.

According to various embodiments, the edge-termination polysilicon and the gate polysilicon may be formed and doped as described with reference to FIGS. 8A to 8D.

According to various embodiments, the edge-termination polysilicon may have the same function as an edge-termination amorphous silicon, which may be deposited on a metal and may be only protected by a passivation stack. However, the proposed edge-termination polysilicon as it is protected by the interlayer dielectric of the dielectric layer 960 may have an improved robustness.

Figure 9E:
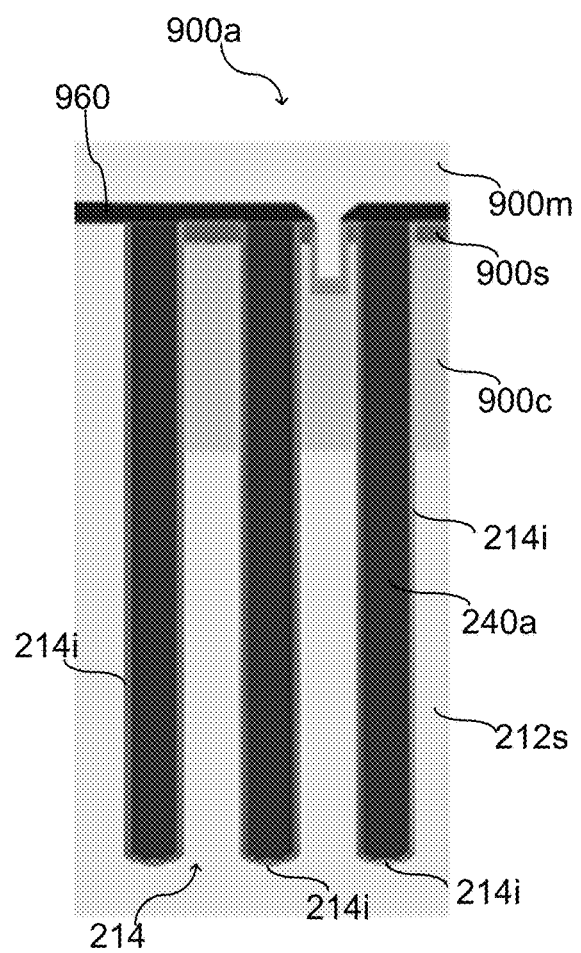
FIG. 9E shows a power semiconductor structure of a semiconductor device in a schematic cross-sectional view, according to various embodiments.

FIG. 9E shows a MOS gated power structure 900a of a semiconductor device 900 including a semiconductor workpiece 202 in a schematic cross-sectional view, according to various embodiments. The trench structure 214 may be formed as described above. The trenches of the trench structure 214 may be filled with gate polysilicon 240a, as described above. According to various embodiments, a gate dielectric layer 214i may be provided between the gate polysilicon 240a and the semiconductor material 212s surrounding the gate polysilicon 240a. According to various embodiments, the semiconductor material 212s (e.g. the first semiconductor portion 212s of the semiconductor workpiece 202) may have the same doping type as a first doped region 900s and opposite to the doping type of a second doped region 900c disposed between the first doped region 900s and the semiconductor material 212s. Therefore, a vertical transistor structure is provided including a trench gate. In a similar way, any other suitable transistor structure may be provided, e.g. a vertical IGBT structure. The vertical transistor structure may be electrically contacted by a metal contact 900m through a dielectric layer 960, or by any other suitable contact structure.

According to various embodiments, instead of an edge-termination structure 900b or additional to an edge-termination structure 900b, as described above, any other functional structure may be provided in the second region 202b of the semiconductor workpiece 202.

According to various embodiments, as illustrated in FIG. 9E in detail, a gate isolation layer 214i (also referred to as gate dielectric layer) is disposed in the trenches 214t of the trench structure 214 covering the inner walls of the trenches 214t at least partially (e.g. partially or completely). The gate isolation layer 214i may be disposed between the semiconductor material 212s and the gate polysilicon 240a. In the same way, any desired isolation layer 214i may be used (e.g. to at least partially cover the inner walls of one or more trenches 214i of the trench structure 214) with reference to the embodiments described above.

Figure 10A:
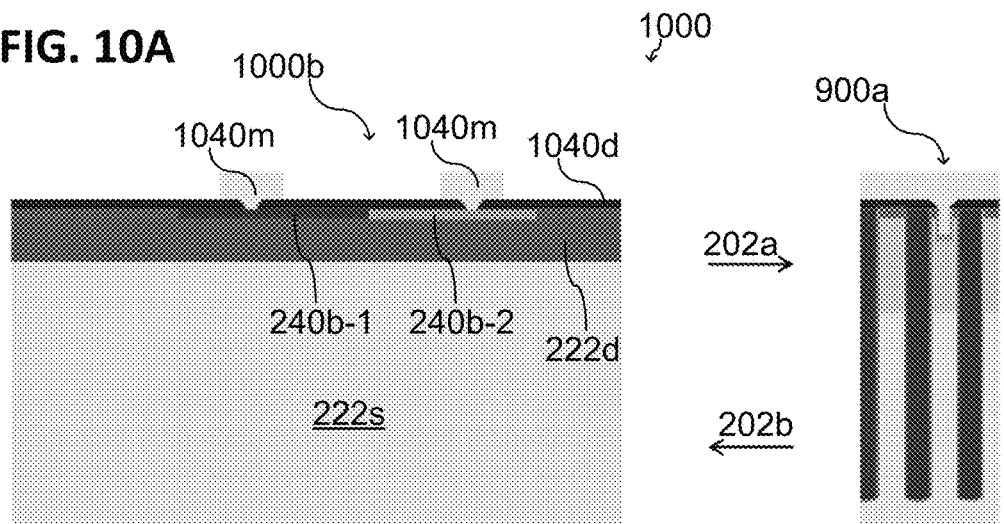
FIGS. 10A to 10E respectively show a semiconductor device including a semiconductor workpiece in a schematic cross-sectional view, according to various embodiments.

FIG. 10A shows a semiconductor device 1000 including a semiconductor workpiece 202 in a schematic cross-sectional view, according to various embodiments. According to various embodiments, a trench based semiconductor structure 900a is provided in the first region 202a of the semiconductor workpiece 202. The trenches 214t of the trench based semiconductor structure 900a may be formed as described above. Further, according to various embodiments, a functional structure 1000b may be provided in the second region 202b of the semiconductor workpiece 202, as described above.

As illustrated in FIG. 10A, the functional structure 1000b may include a diode structure (e.g. a PN diode), according to various embodiments. The diode structure may include, for example, two oppositely doped regions 240b-1, 240b-2 provided in the material portion 240b remaining in the recess 242 in the second region 202b of the semiconductor workpiece 202, as described above. The two oppositely doped regions 240b-1, 240b-2 may be electrically contacted, e.g. by at least two metal contacts 1040m through a dielectric layer 1040d or by any other suitable contact structure. The PN diode may be used for example as a temperature sensor or as a protection diode (e.g. as an ESD protection diode).

According to various embodiments, a MOS gated power device 900a may be formed in the first region 202a of the semiconductor workpiece 202, e.g. with layout modifications and some processing modifications. The gate polysilicon filling the trenches of the MOS gated power device 900a (e.g. the gate material of the MOS gated power device 900a) may be formed (e.g. deposited) with a doping level higher (or alternatively lower) than or equal to the doping level of the diode polysilicon of the PN diode. The diode polysilicon may be protected partially or completely during the doping of the gate polysilicon. The diode polysilicon doping of opposite doping type with respect to the gate polysilicon may be performed without masking. The diode fabrication process described herein may be cheaper than congenitally used manufacturing processes.

Figure 10B:
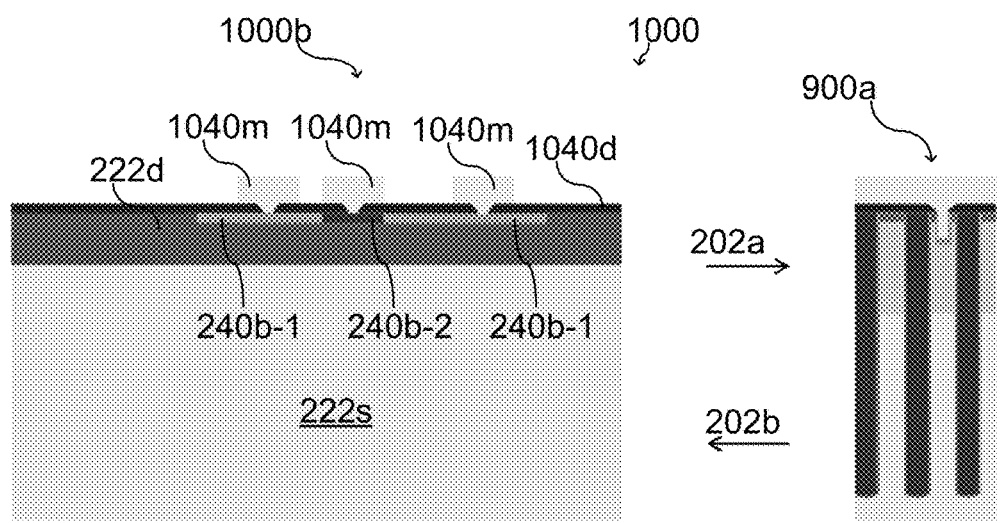

FIG. 10B shows a semiconductor device 1000 including a semiconductor workpiece 202 in a schematic cross-sectional view, according to various embodiments. According to various embodiments, a trench based semiconductor structure 900a is provided in the first region 202a of the semiconductor workpiece 202. The trenches 214t of the trench based semiconductor structure 900a may be formed as described above. Further, according to various embodiments, a functional structure 1000b may be provided in the second region 202b of the semiconductor workpiece 202, as described above.

As illustrated in FIG. 10B, the functional structure 1000b may include a transistor structure (e.g. an NPN or PNP bipolar junction transistor), according to various embodiments. The transistor structure may include, for example, a first doped region 240b-1 and a third doped region 240b-3 of the same doping type and an oppositely doped second region 240b-2 disposed between the first doped region 240b-1 and the third doped region 240b-3. The doped regions 240b-1, 240b-2, 240b-3 of the transistor structure may be provided in the material portion 240b remaining in the recess 242 in the second region 202b of the semiconductor workpiece 202, as described above. The doped regions 240b-1, 240b-2, 240b-3 of the transistor structure may be electrically contacted, e.g. by a plurality of metal contacts 1040m through a dielectric layer 1040d or by any other suitable contact structure. The transistor structure may be used for example as a temperature sensor or as a protection transistor (e.g. as an ESD protection transistor).

According to various embodiments, a MOS gated power device 900a may be formed in the first region 202a of the semiconductor workpiece 202, e.g. with layout modifications and some processing modifications. The gate polysilicon filling the trenches of the MOS gated power device 900a (e.g. the gate material of the MOS gated power device 900a) may be formed (e.g. deposited) with a doping level higher (or alternatively lower) than or equal to the doping level of the polysilicon of the transistor structure. The polysilicon of the transistor structure may be protected partially or completely during the doping of the gate polysilicon. The transistor structure polysilicon doping of opposite doping type with respect to the gate polysilicon may be performed without masking. The transistor fabrication process described herein may be cheaper than congenitally used manufacturing processes.

Figure 10C:
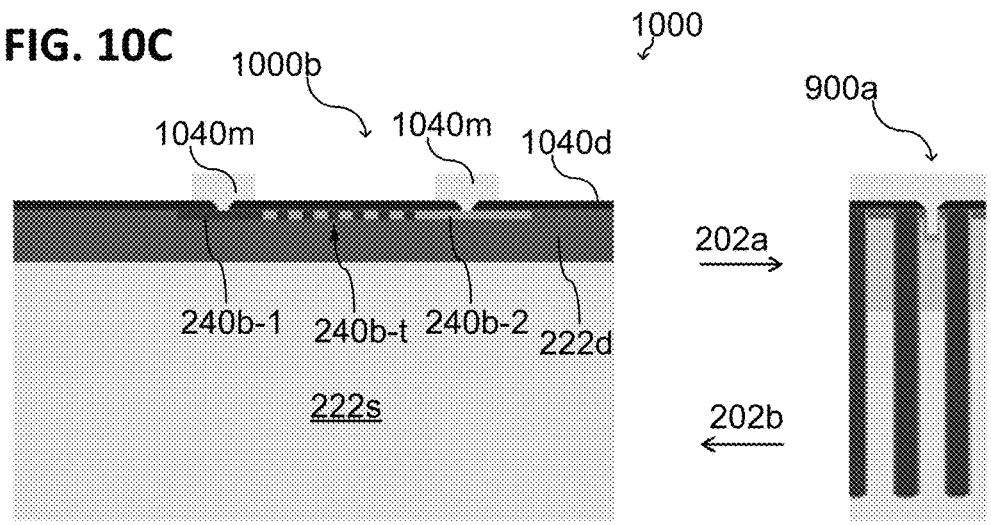

FIG. 10C shows a semiconductor device 1000 including a semiconductor workpiece 202 in a schematic cross-sectional view, according to various embodiments. According to various embodiments, a trench based semiconductor structure 900a is provided in the first region 202a of the semiconductor workpiece 202. The trenches 214t of the trench based semiconductor structure 900a may be formed as described above. Further, according to various embodiments, a functional structure 1000b may be provided in the second region 202b of the semiconductor workpiece 202, as described above.

As illustrated in FIG. 10C, the functional structure 1000b may include a tunneling diode structure, according to various embodiments. The tunneling diode structure may include, for example, a first doped region 240b-1 and a second region 240b-2 of opposite doping type and a third doped region 240b-t disposed between the first doped region 240b-1 and the second doped region 240b-2. The third doped region 240b-t may include a plurality of alternatingly doped portions. The doped regions 240b-1, 240b-2, 240b-t of the tunneling diode structure may be provided in the material portion 240b remaining in the recess 242 in the second region 202b of the semiconductor workpiece 202, as described above. The first doped region 240b-1 and the second doped region 240b-2 of the tunneling diode structure may be electrically contacted, e.g. by at least two metal contacts 1040m through a dielectric layer 1040d or by any other suitable contact structure. The tunneling diode structure may be used for example as a temperature sensor or as a protection diode.

According to various embodiments, a MOS gated power device 900a may be formed in the first region 202a of the semiconductor workpiece 202, e.g. with layout modifications and some processing modifications. The gate polysilicon filling the trenches of the MOS gated power device 900a (e.g. the gate material of the MOS gated power device 900a) may be formed (e.g. deposited) with a doping level higher or lower than the doping level of the polysilicon of the transistor structure.

If the final doping level of the gate polysilicon is higher than the doping of the diode of the opposite type, the gate polysilicon may be deposited with a doping level lower than the doping level of the diode polysilicon. The diode polysilicon may be protected partially or completely during the doping of the gate polysilicon. The diode doping of opposite type with respect to the gate polysilicon may be performed without masking. In the opposite case, if the doping level of the final gate polysilicon is lower than the desired diode doping level of the opposite type, the gate polysilicon may be doped in-situ during deposition. However the gate polysilicon may be protected during the diode opposite type doping.

Figure 10D:
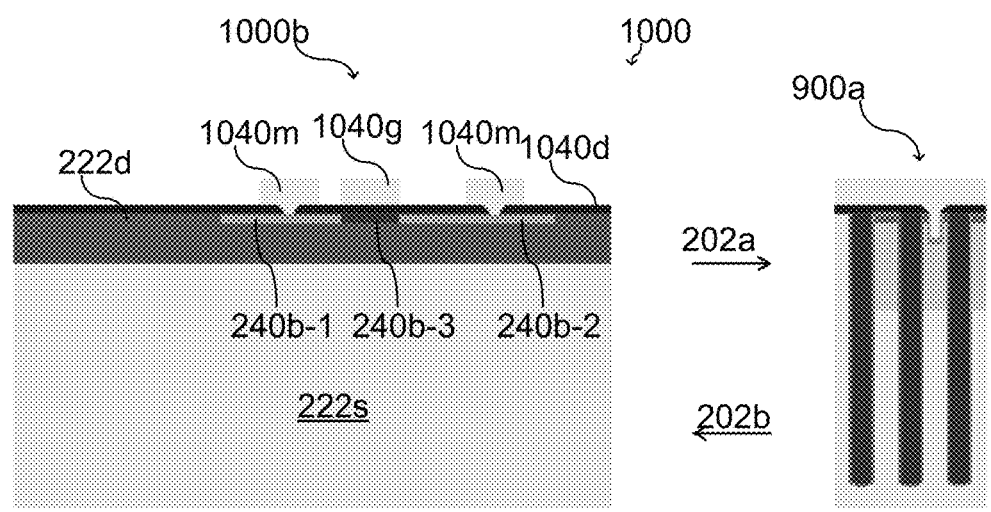

FIG. 10D shows a semiconductor device 1000 including a semiconductor workpiece 202 in a schematic cross-sectional view, according to various embodiments. According to various embodiments, a trench based semiconductor structure 900a is provided in the first region 202a of the semiconductor workpiece 202. The trenches 214t of the trench based semiconductor structure 900a may be formed as described above. Further, according to various embodiments, a functional structure 1000b may be provided in the second region 202b of the semiconductor workpiece 202, as described above.

As illustrated in FIG. 10D, the functional structure 1000b may include a field-effect transistor structure (e.g. a MOS transistor structure), according to various embodiments. The field-effect transistor structure may include, for example, a first doped region 240b-1 and a second doped region 240b-2 of the same doping type and a third doped region 240b-3 disposed between the first doped region 240b-1 and the second doped region 240b-2 of the opposite doping type. According to various embodiments, the third doped region 240b-3 may have a lower doping concentration than the first doped region 240b-1 and the second doped region 240b-2. The doped regions 240b-1, 240b-2, 240b-3 of the field-effect transistor structure may be provided in the material portion 240b remaining in the recess 242 in the second region 202b of the semiconductor workpiece 202, as described above. The first doped region 240b-1 and the second doped region 240b-2 of the field-effect transistor structure may be electrically contacted, e.g. by at least two metal contacts 1040m through a dielectric layer 1040d or by any other suitable contact structure. Further, a gate portion 1040g may be provided over the third doped region 240b-3 separated from the third doped region 240b-3 by a gate dielectric layer. The field-effect transistor structure may be used for example as a temperature sensor or as a protection transistor.

According to various embodiments, a MOS gated power device 900a may be formed in the first region 202a of the semiconductor workpiece 202, e.g. with layout modifications and some processing modifications. The gate polysilicon filling the trenches of the MOS gated power device 900a (e.g. the gate material of the MOS gated power device 900a) may be formed (e.g. deposited) with a doping level higher (or, alternatively, lower) than the doping level of the polysilicon of the field-effect transistor structure. The polysilicon of the field-effect transistor structure may be protected partially or completely during the doping of the gate polysilicon. The polysilicon doping of the field-effect transistor structure of opposite type with respect to the gate polysilicon can be performed without masking.

Figure 10E:
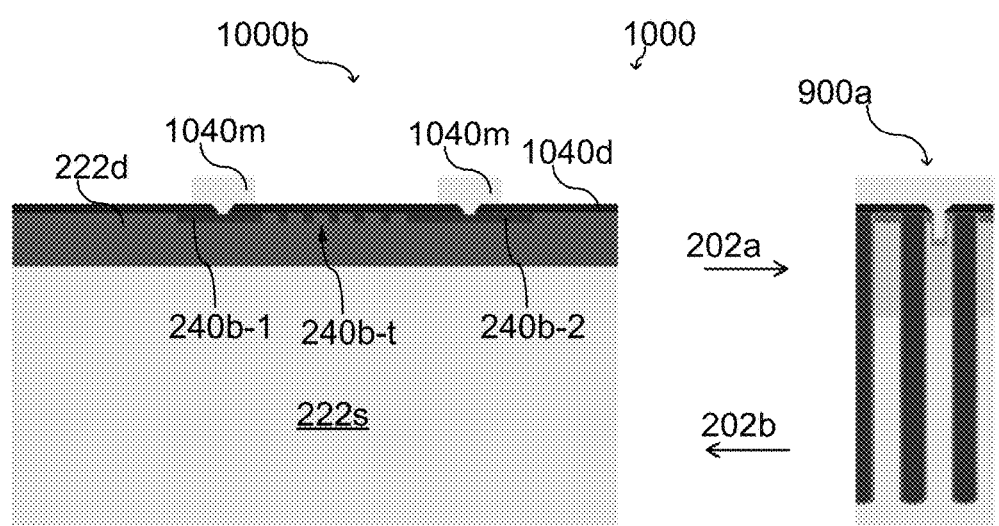

FIG. 10E shows a semiconductor device 1000 including a semiconductor workpiece 202 in a schematic cross-sectional view, according to various embodiments. According to various embodiments, a trench based semiconductor structure 900a is provided in the first region 202a of the semiconductor workpiece 202. The trenches 214t of the trench based semiconductor structure 900a may be formed as described above. Further, according to various embodiments, a functional structure 1000b may be provided in the second region 202b of the semiconductor workpiece 202, as described above.

As illustrated in FIG. 10E, the functional structure 1000b may include a resistor structure, according to various embodiments. The resistor structure may include, for example, a first doped region 240b-1, a second doped region 240b-2, and a third doped region 240b-t disposed between the first doped region 240b-1 of the same doping. According to various embodiments, the third doped region 240b-t may include a plurality of semiconductor portions separated from each other. The doped regions 240b-1, 240b-2, 240b-t of the resistor structure may be provided in the material portion 240b remaining in the recess 242 in the second region 202b of the semiconductor workpiece 202, as described above. The first doped region 240b-1 and the second doped region 240b-2 of the field-effect transistor structure may be electrically contacted, e.g. by at least two metal contacts 1040m through a dielectric layer 1040d or by any other suitable contact structure. The resistor structure may be used for example as a temperature sensor or as a gate resistor.

According to various embodiments, a MOS gated power device 900a may be formed in the first region 202a of the semiconductor workpiece 202, e.g. with layout modifications and some processing modifications. The gate polysilicon filling the trenches of the MOS gated power device 900*a* (e.g. the gate material of the MOS gated power device 900*a*) may be formed (e.g. deposited) with a doping level higher or lower than (or equal to) the doping level of the polysilicon of the resistor structure.

According to various embodiments, if the desired doping level and doping type of the polysilicon of the resistor structure differs from the ones of the gate polysilicon, processing modifications may be implemented. In this case, the gate polysilicon can be deposited with a doping level lower than to the one of the polysilicon of the resistor structure. The polysilicon of the resistor structure may be protected partially or completely during the doping of the gate polysilicon. The polysilicon of the resistor structure doping of opposite type with respect to the gate poly may be performed without masking, if its doping level is lower. Compared to a deep trench resistor, the resistor structure provided herein requires a smaller area (e.g. about 10 times smaller).

In the following, various examples are provided referring to one or more of the embodiments as described above.

Example 1 is a method 100 for processing a semiconductor workpiece 202, the method including: forming a trench structure 214 in a first region 202*a* of a semiconductor workpiece, the trench structure extending from a surface 202*s* of the semiconductor workpiece into the semiconductor workpiece to a first depth 215, forming at least one a recess 224 in a second region 202*b* of the semiconductor workpiece laterally next to the first region, the at least one recess extending from the surface 202*s* of the semiconductor workpiece into the semiconductor workpiece to a second depth 225 less than the first depth; forming at least one material layer 230 over the semiconductor workpiece, the at least one material layer filling the trench structure 214 and the at least one recess 224 and covering the surface 202*s* of the semiconductor workpiece in the first region and in the second region; and planarizing the semiconductor workpiece 202 to partially remove the at least one material layer 230 in the first region and in the second region, wherein the at least one material layer 240*a*, 240*b* remains in the trench structure 214 and in the at least one recess 224.

In Example 2, the method according to Example 1 may optionally include that forming the trench structure includes forming a plurality of trenches 214*t* laterally next to each other. According to various embodiments, the least one recess 224 may be formed during one or more processing stages used for the formation of the trench structure 214.

In Example 3, the method according to Example 2 may optionally include that each trench of the plurality of trenches is formed with the first depth and a first width 211, and that the at least one recess is formed with a second width 221 greater than the first width.

In Example 4, the method according to any one of Examples 1 to 3 may optionally include that the at least one material layer includes or consists of a semiconductor material.

In Example 5, the method according to any one of Examples 1 to 4 may optionally further include: forming a first insulating layer 214*i* in the first region of the semiconductor workpiece to separate the at least one material layer remaining in the trench structure from a first portion 212*s* of the semiconductor workpiece below the first insulating layer 214*i*.

In Example 6, the method according to Example 5 may optionally further include: forming a second insulating layer 724*i* in the second region of the semiconductor workpiece to separate the at least one material layer remaining in the at least one recess from a second portion 222*s* of the semiconductor workpiece below the second insulating layer.

In Example 7, the method according to Example 6 may optionally include that the first insulating layer 214*i* and the second insulating layer 724*i* are formed to have the same thickness.

In Example 8, the method according to Example 6 may optionally include that the first insulating layer 214*i* is formed with a first thickness and wherein the second insulating layer 724*i* is formed with a second thickness greater than the first thickness.

In Example 9, the method according to any one of Examples 6 to 8 may optionally include that the first portion of the semiconductor workpiece includes a semiconductor material.

In Example 10, the method according to any one of Examples 6 to 9 may optionally include that the second portion of the semiconductor workpiece includes a semiconductor material.

In Example 11, the method according to any one of Examples 1 to 10 may optionally include that the first region is a power device region and wherein the trench structure is part of a power device structure 900*a*.

In Example 12, the method according to Example 11 may optionally include that the power device structure 900*a* includes a field-effect transistor structure and that the at least one material layer remaining in the trench structure 214 is a part of the gate structure of the field-effect transistor structure.

In Example 13, the method according to Example 12 may optionally include that the first insulating layer 214*i* is a gate dielectric layer of the field-effect transistor structure.

In Example 14, the method according to any one of Examples 1 to 13 may optionally include that the first region 202*a* is vertical device region and that the at least one material layer remaining in the trench structure is part of a vertical semiconductor structure.

In Example 15, the method according to Example 14 may optionally include that the vertical semiconductor structure includes a vertical diode structure, a vertical transistor structure, or a vertical thyristor structure.

In Example 16, the method according to any one of Examples 1 to 15 may optionally include that the second region 202*b* is a functional region and wherein the at least one material layer remaining in the at least one recess is part of a functional structure.

In Example 17, the method according to Example 16 may optionally include that the second region is a sensor and/or protection region, and that the at least one material layer remaining in the at least one recess 224 is part of a sensor and/or protection structure 1000*b*.

In Example 18, the method according to Example 16 may optionally include that the second region 202*b* is an edge-termination region for the first region and that the at least one material layer remaining in the at least one recess is part of an edge-termination structure 900*b*.

In Example 19, the method according to any one of Examples 1 to 15 may optionally include that the second region 202*b* is a lateral device region, and that the at least one material layer remaining in the at least one recess 242 is part of a lateral semiconductor structure 900*b*, 1000*b*. According to various embodiments, the lateral semiconductor structure 900*b*, 1000*b* may include a lateral diode structure, a lateral transistor structure, a lateral thyristor structure, and/or a lateral resistor structure.

In Example 20, the method according to any one of Examples 1 to 19 may optionally include that the at least one recess includes a plurality of recesses, wherein each of the recesses may be part one or more of the following structures: an edge-termination structure, a sensor structure, or a lateral device.

In Example 21, the method according to any one of Examples 1 to 20 may optionally include that the at least one material layer remaining in the trench structure 214 includes a semiconductor material doped with a first dopant type and a first dopant concentration; and that the at least one material layer remaining in the at least one recess 224 includes a semiconductor material doped with a second dopant type and a second dopant concentration.

In Example 22, the method according to Example 21 may optionally include that the first dopant type is the same as the second dopant type.

In Example 23, the method according to Example 21 may optionally include that the first dopant type is different from the second dopant type.

In Example 24, the method according to any one of Examples 21 to 23 may optionally include that the first dopant concentration is the same as the second dopant concentration.

In Example 25, the method according to any one of Examples 21 to 23 may optionally include that the first dopant concentration is different from the second dopant concentration.

Example 26 is a semiconductor device 900, 1000, including: a trench structure 214 in a first region 202a of a semiconductor workpiece 202, the trench structure 214 including a plurality of trenches 214t, each trench of the plurality of trenches 214t extending from a surface 202s of the semiconductor workpiece 202 into the semiconductor workpiece to a first depth 215 and having a first width 211, at least one recess 224 in a second region 202b of the semiconductor workpiece 202 laterally next to the first region 202a, the at least one recess 224 extending from the surface 202s of the semiconductor workpiece 202 into the semiconductor workpiece with a second depth 225 less than the first depth 215 and with a second width 221 greater than the first width 211; and at least one material layer 240a, 240b, 850a, 850b disposed in the plurality of trenches 214t and in the at least one recess 224, wherein a portion of the surface 202s laterally outside of the plurality of trenches 214t and of the at least one recess 224 is free of the at least one material layer 240a, 240b, 850a, 850b.

In Example 27, the semiconductor device 900, 1000 according to Example 26 may optionally include that the material layer 240a, 240b, 850a, 850b includes or consist of a semiconductor material.

In Example 28, the semiconductor device 900, 1000 according to Example 27 may optionally include that the semiconductor material is polycrystalline silicon.

In Example 29, the semiconductor device 900, 1000 according to any one of Examples 26 to 28 may optionally further include: a first insulating layer 214i in the first region 202a of the semiconductor workpiece 202 separating the material layer 240a, 850a from a first portion 212s of the semiconductor workpiece 202 below the first insulating layer 214i.

In Example 30, the semiconductor device 900, 1000 according to Example 29 may optionally further include: a second insulating layer 724i in the second region 202b of the semiconductor workpiece 202 separating the material layer 240b, 850b from a second portion 222s of the semiconductor workpiece 202 below the second insulating layer.

In Example 31, the semiconductor device 900, 1000 according to Example 30 may optionally include that the first insulating layer 214i and the second insulating layer 724i have the same thickness.

In Example 32, the semiconductor device 900, 1000 according to Example 31 may optionally include that the first insulating layer 214i has a first thickness and wherein the second insulating layer 724i has a second thickness greater than the first thickness.

In Example 33, the semiconductor device 900, 1000 according to any one of Examples 30 to 32 may optionally include that the first portion 212s of the semiconductor workpiece 202 includes a semiconductor material.

In Example 34, the semiconductor device 900, 1000 according to any one of Examples 30 to 33 may optionally include that the second portion 222s of the semiconductor workpiece 202 includes a semiconductor material.

In Example 35, the semiconductor device 900, 1000 according to any one of Examples 26 to 35 may optionally include that the first region 202a is a power device region and that the trench structure 214 is part of a power device structure 900a.

In Example 36, the semiconductor device 900, 1000 according to Example 35 may optionally include that the power device structure 900a includes a field-effect transistor structure and that the material layer 240a, 850a disposed in the trench structure 214 is a part of the gate structure of the field-effect transistor structure.

In Example 37, the semiconductor device 900, 1000 according to Example 36 may optionally include that the first insulating layer 214i is a gate dielectric layer of the field-effect transistor structure.

In Example 38, the semiconductor device 900, 1000 according to any one of Examples 26 to 37 may optionally include that the first region 202a is vertical device region and wherein the material layer 240a, 850a disposed in the trench structure 214 is part of a vertical semiconductor structure 900a.

In Example 39, the semiconductor device 900, 1000 according to Example 38 may optionally include that the vertical semiconductor structure 900a includes a vertical diode structure, a vertical transistor structure, or a vertical thyristor structure.

In Example 40, the semiconductor device 900, 1000 according to any one of Examples 26 to 39 may optionally include that the second region 202b is a functional region and wherein the material layer 240b, 850b disposed in the at least one recess 224 is part of a functional structure 900b, 1000b.

In Example 41, the semiconductor device 900, 1000 according to Example 40 may optionally include that the second region 202b is a sensor region and wherein the material layer 240b, 850b disposed in the at least one recess 224 is part of a sensor structure 1000b.

In Example 42, the semiconductor device 900, 1000 according to Example 41 may optionally include that the second region 202b is an edge-termination region for the first region and that the material layer 240b, 850b disposed in the at least one recess 224 is part of an edge-termination structure 900b.

In Example 44, the semiconductor device 900, 1000 according to any one of Examples 26 to 43 may optionally include that the second region 202b is lateral device region and that the material layer 240b, 850b disposed in the at least one recess 224 is part of a lateral semiconductor structure 900b, 1000b.

In Example 44, the semiconductor device 900, 1000 according to Example 43 may optionally include that the lateral semiconductor structure 1000b includes a lateral diode structure, a lateral transistor structure, a lateral thyristor structure, and/or a lateral resistor structure.

In Example 45, the semiconductor device 900, 1000 according to any one of Examples 26 to 45 may optionally include that the material layer 240*a*, 850*a* disposed in the trench structure 214 includes a semiconductor material doped with a first dopant type and a first dopant concentration; and that the material layer 240*b*, 850*b* disposed in the at least one recess 224 includes a semiconductor material doped with a second dopant type and a second dopant concentration.

In Example 46, the semiconductor device 900, 1000 according to Example 45 may optionally include that the first dopant type is the same as the second dopant type.

In Example 47, the semiconductor device 900, 1000 according to Example 45 may optionally include that the first dopant type is different from the second dopant type.

In Example 48, the semiconductor device 900, 1000 according to any one of Examples 45 to 47 may optionally include that the first dopant concentration is the same as the second dopant concentration.

In Example 49, the semiconductor device 900, 1000 according to any one of Examples 45 to 47 may optionally include that the first dopant concentration is different from the second dopant concentration.

Example 50 is a semiconductor device 900, including: a first region 202*a* and a second region 202*b* arranged laterally next to the first region in a semiconductor workpiece 202, the first region 202*a* defining a planar surface level 205 of the semiconductor workpiece; a power semiconductor structure 900*a* disposed in the first region 202*a*, the power semiconductor structure 900*a* including a trench structure 214 extending from the planar surface level 205 of the semiconductor workpiece 202 into the semiconductor workpiece, an edge-termination structure 900*b* disposed in the second region 202*b* of the semiconductor workpiece 202, the edge-termination structure 900*b* including a dielectric portion 222*d* disposed in a surface region of the semiconductor workpiece 202 and at least one recess 224 in the dielectric portion 222*d*, the at least one recess 224 extending from the planar surface level 205 into the semiconductor workpiece 202; and a material layer 240*a*, 240*b*, 850*a*, 850*b* filling the at least one recess 224 and the trench structure 214 at least partially.

In Example 51, the semiconductor device 900 according to Example 50 may optionally include that the semiconductor workpiece 202 is free of the material layer 240*a*, 240*b*, 850*a*, 850*b* in regions above the planar surface level 205.

In Example 52, the semiconductor device 900 according to Example 50 or 51 may optionally include that a portion of the surface 202*s* laterally outside of the trench structure 214 and of the at least one recess 224 is free of the at least one material layer 240*a*, 240*b*, 850*a*, 850*b*.

In Example 53, the semiconductor device 900 according to any one of Examples 50 to 52 may optionally include that an upper surface of the dielectric portion 222*d* in the second region 202*b* is at a same level as an upper surface of a semiconductor portion 212*s* of the semiconductor workpiece 202 in the first region 202*a*.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for processing a semiconductor workpiece, the method comprising:
    forming a trench structure in a power device region of a semiconductor workpiece, the trench structure extending from a surface of the semiconductor workpiece into the semiconductor workpiece to a first depth,
    forming at least one recess in a functional region of the semiconductor workpiece laterally next to the power device region, the at least one recess extending from the surface of the semiconductor workpiece into the semiconductor workpiece to a second depth less than the first depth, wherein the at least one recess comprises a width greater than the second depth;
    forming at least one material layer over the semiconductor workpiece, wherein the at least one material layer comprises a semiconductor material, to fill the trench structure and the at least one recess and to cover the surface of the semiconductor workpiece in the power device region and in the functional region;
    planarizing the semiconductor workpiece to partially remove the at least one material layer in the power device region and in the functional region, wherein first portions of the at least one material layer remain in the trench structure and a second portion of the at least one material layer remains in the recess;
    forming a power device structure in the power device region, wherein the first portions of the at least one material layer are part of the power device structure; and
    forming a functional structure in the functional region, wherein the second portion of the at least one material layer is part of the functional structure.

2. The method according to claim 1,
    wherein forming the trench structure comprises forming a plurality of trenches laterally next to each other.

3. The method according to claim 1,
    wherein the least one recess and the trench structure are formed during at least one common processing stage.

4. The method according to claim 2,
    wherein each trench of the plurality of trenches is formed to have the first depth and a width, wherein the respective width of the respective trench of the plurality of trenches is less than the width of the at least one recess.

5. The method according to claim 1, further comprising:
    forming a first insulating layer in the power device region of the semiconductor workpiece to separate the first portions of the at least one material layer remaining in the trench structure from a first portion of the semiconductor workpiece below the first insulating layer.

6. The method according to claim 5, further comprising:
    forming a second insulating layer in the functional region of the semiconductor workpiece to separate the second portion of the at least one material layer remaining in the at least one recess from a second portion of the semiconductor workpiece below the second insulating layer.

7. The method according to claim 5,
    wherein the first portion of the semiconductor workpiece comprises a semiconductor material, or
    wherein the second portion of the semiconductor workpiece comprises a semiconductor material.

8. The method according to claim 1,
    wherein the power device structure comprises a field-effect transistor structure and wherein the first portions of the at least one material layer remaining in the trench structure are part of a gate structure of the field-effect transistor structure.

9. The method according to claim 1, wherein the power device region is a vertical device region and wherein the first portions of the at least one material layer remaining in the trench structure are part of a vertical semiconductor structure.

10. The method according to claim 9, wherein the vertical semiconductor structure comprises a vertical diode structure, a vertical transistor structure, or a vertical thyristor structure.

11. The method according to claim 1, wherein the functional region is at least one of a sensor region or a protection region, and wherein the second portion of the at least one material layer remaining in the at least one recess is part of at least one of a sensor structure or a protection structure.

12. The method according to claim 1, wherein the functional region is an edge-termination region for the power device region and wherein the second portion of the at least one material layer remaining in the at least one recess is part of an edge-termination structure.

13. The method according to claim 1, wherein the functional region is a lateral device region, and wherein the second portion of the at least one material layer remaining in the at least one recess is part of a lateral semiconductor structure.

14. The method according to claim 13, wherein the lateral semiconductor structure comprises at least one of the following lateral semiconductor structures:
   a lateral diode structure,
   a lateral transistor structure,
   a lateral thyristor structure, or
   a lateral resistor structure.

15. The method according to claim 1, wherein the at least one recess comprises a plurality of recesses, wherein each of the recesses may be part of one or more of the following structures:
   an edge-termination structure,
   a sensor structure, or
   a lateral device.

16. The method according to claim 1, wherein the first portions of the at least one material layer remaining in the trench structure comprise a semiconductor material doped with a first dopant type and a first dopant concentration; and wherein the second portion of the at least one material layer remaining in the at least one recess comprises a semiconductor material doped with a second dopant type and a second dopant concentration.

17. A semiconductor device, comprising:
a trench structure in a power device region of a semiconductor workpiece, the trench structure comprising a plurality of trenches, each trench of the plurality of trenches extending from a surface of the semiconductor workpiece into the semiconductor workpiece to a first depth and having a first width,
at least one recess in a functional region of the semiconductor workpiece laterally next to the power device region, the at least one recess extending from the surface of the semiconductor workpiece into the semiconductor workpiece with a second depth less than the first depth and with a second width greater than the first width, wherein the second width of the at least one recess is greater than the second depth; and
a plurality of material layer portions comprising a semiconductor material, wherein a respective first material portion of the plurality of material layer portions is disposed in a respective trench of the plurality of trenches that is part of a power device structure, wherein a second material portion of the plurality of material layer portions is disposed in the at least one recess that is part of a functional structure, and wherein a portion of the surface laterally outside of the plurality of trenches and of the at least one recess is free from the plurality of material layer portions.

18. The semiconductor device according to claim 17, wherein the functional region is at least one of a sensor region or a protection region, and wherein the second material layer portion disposed in the at least one recess is part of at least one of a sensor structure or a protection structure.

19. The semiconductor device according to claim 17, wherein the functional region is a lateral device region, and wherein the second material layer portion disposed in the at least one recess is part of a lateral semiconductor structure.

20. A semiconductor device, comprising:
a power device region and an edge-termination region arranged laterally next to the power device region in a semiconductor workpiece, the power device region defining a planar surface level of the semiconductor workpiece;
a power semiconductor structure disposed in the power device region, the power semiconductor structure comprising a trench structure extending from the planar surface level of the semiconductor workpiece into the semiconductor workpiece,
an edge-termination structure disposed in the edge-termination region of the semiconductor workpiece, the edge-termination structure comprising a dielectric portion disposed in a surface region of the semiconductor workpiece and at least one recess in the dielectric portion, the at least one recess extending from the planar surface level into the semiconductor workpiece and comprising a width and a depth, wherein the width is greater than the depth; and
a plurality of material layer portions filling the at least one recess and the trench structure at least partially, wherein each of the plurality of material layer portions comprises a semiconductor material.

* * * * *